US012062993B2

(12) United States Patent
Moriwaki et al.

(10) Patent No.: US 12,062,993 B2
(45) Date of Patent: Aug. 13, 2024

(54) BOOSTER CIRCUIT AND VOLTAGE GENERATOR

(71) Applicant: Mitsubishi Electric Corporation, Tokyo (JP)

(72) Inventors: Masato Moriwaki, Tokyo (JP); Fumihito Izawa, Tokyo (JP); Yohei Araki, Tokyo (JP); Noriyuki Matsubara, Hyogo (JP); Masato Achihara, Hyogo (JP); Yuya Yamashita, Hyogo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/005,160

(22) PCT Filed: Aug. 3, 2021

(86) PCT No.: PCT/JP2021/028746
§ 371 (c)(1),
(2) Date: Jan. 11, 2023

(87) PCT Pub. No.: WO2022/030478
PCT Pub. Date: Feb. 10, 2022

(65) Prior Publication Data
US 2023/0261586 A1 Aug. 17, 2023

(30) Foreign Application Priority Data
Aug. 6, 2020 (JP) .................................. 2020-133584

(51) Int. Cl.
*H02M 3/08* (2006.01)
*H02M 7/00* (2006.01)
(Continued)

(52) U.S. Cl.
CPC ............. *H02M 7/106* (2013.01); *H02M 3/08* (2013.01); *H02M 7/003* (2013.01); *H01J 37/241* (2013.01)

(58) Field of Classification Search
CPC ........ H02M 7/106; H02M 3/08; H02M 3/003; H02M 3/07
See application file for complete search history.

(56) References Cited

U.S. PATENT DOCUMENTS

| | | | |
|---|---|---|---|
| 10,050,550 B2 | 8/2018 | Morita et al. | |
| 2014/0077886 A1* | 3/2014 | Gorrell | H02M 7/106 330/310 |

(Continued)

FOREIGN PATENT DOCUMENTS

| | | |
|---|---|---|
| JP | S61142929 A | 6/1986 |
| WO | 2015005380 A1 | 1/2015 |

OTHER PUBLICATIONS

International Search Report (PCT/ISA/210) with translation and Written Opinion (PCT/ISA/237) mailed on Oct. 5, 2021, by the Japan Patent Office as the International Searching Authority for International Application No. PCT/JP2021/028746. (8 pages).

*Primary Examiner* — Alex Torres-Rivera
(74) *Attorney, Agent, or Firm* — Buchanan Ingersoll & Rooney PC

(57) ABSTRACT

A booster circuit includes, at a substrate end of an insulating substrate, an input part of voltage, an output part of voltage, and a conductive L-shaped joint fitting. The L-shaped joint fitting includes a plate-shaped bottom surface portion attached to the insulating substrate and a plate-shaped back surface portion bent from the bottom surface portion and extending in a specific direction. In the input part and the output part, a capacitor, a diode, and a connection line connecting the insulating substrates are electrically connected at a component connecting portion, and the L-shaped (Continued)

joint fitting is disposed such that a lead forming portion of a lead connected to the capacitor, a lead forming portion of a lead connected to the diode, and the component connecting portion fit within an area of a main surface of the back surface portion and an area of a main surface of the bottom surface portion.

20 Claims, 19 Drawing Sheets

(51) Int. Cl.
*H02M 7/10* (2006.01)
*H01J 37/24* (2006.01)

(56) References Cited

U.S. PATENT DOCUMENTS

2016/0262250 A1* 9/2016 Mao ..................... H02M 7/103
2016/0308434 A1* 10/2016 Warmack .............. H02M 7/106

* cited by examiner

BOOSTER CIRCUIT AND VOLTAGE GENERATOR

FIELD

The present disclosure relates to a booster circuit that boosts a voltage and a voltage generator.

BACKGROUND

A voltage generator used for accelerating an electron beam in an electron gun, an ion beam generator, an electron microscope, or the like includes a Cockcroft-Walton (CW) circuit as a circuit that converts an alternating current voltage into a direct current voltage. This voltage generator includes a stack of a plurality of insulating substrates including booster circuits, and the booster circuits boost a voltage in stages to generate a high voltage.

The booster circuit of the voltage generator includes a component having a low withstand voltage, but the voltage increases as it nears an output part thereof. This results in a large potential difference between a low-voltage part and a high-voltage part, and discharge is likely to occur between terminals or between the high-voltage part and an outer peripheral container. In order to prevent the occurrence of such discharge, the insulation tolerance needs to be sufficiently secured, but increasing the insulation tolerance involves an increase in size of the voltage generator.

In a CW circuit included in a voltage generator described in Patent Literature 1, capacitors having end electrodes at both ends are connected in series on a board, and a diode is connected to the point of connection between the capacitors. Also, at an end of the board, a high-voltage output cable is connected to a component connecting portion that is the connecting portion between the capacitor and the diode, and the component connecting portion is disposed so as not to lie outside the space between the end electrode of the capacitor and a tip portion of the high-voltage output cable. As a result, the voltage generator described in Patent Literature 1 achieves miniaturization while preventing the occurrence of discharge by relaxing the electric field of the component connecting portion.

CITATION LIST

Patent Literature

Patent Literature 1: International Publication No. WO 2015/005380

SUMMARY

Technical Problem

However, in the technique of Patent Literature 1 described above, depending on the routing of the high-voltage output cable, it is difficult to accommodate the component connecting portion and a lead forming portion as a CW circuit component, from which discharge is likely to originate, in the space between the end electrode of the capacitor and the tip portion of the high-voltage output cable, and it is difficult to manufacture the CW circuit. Also, the diameter of the high-voltage output cable needs to have a size corresponding to that of the end electrode of the capacitor, and it is difficult to manufacture the CW circuit.

The present disclosure has been made in view of the above, and an object thereof is to provide a booster circuit that can be easily manufactured and can prevent the occurrence of discharge.

Solution to Problem

In order to solve the above problem and achieve the object, the present disclosure is a booster circuit that boosts a voltage by a plurality of capacitors and a plurality of diodes disposed on an insulating substrate, and includes an input part that is disposed at a substrate end of the insulating substrate and receives a voltage, an output part that is disposed at the substrate end and outputs a boosted voltage, and an L-shaped joint fitting that is a conductive L-shaped joint fitting disposed at the substrate end. The L-shaped joint fitting includes a first bottom surface portion that is plate-shaped and attached to the insulating substrate, and a first back surface portion that is plate-shaped, is bent from the first bottom surface portion, and extends in a specific direction. In the input part and the output part, a first capacitor that is a capacitor disposed at the substrate end among the capacitors, a first diode that is a diode disposed at the substrate end among the diodes, and a connection line that connects the insulating substrates are electrically connected at a first component connecting portion included in the L-shaped joint fitting. The L-shaped joint fitting is disposed such that a first lead forming portion that is a bent portion of a first lead connected to the first capacitor, a second lead forming portion that is a bent portion of a second lead connected to the first diode, and the first component connecting portion fit within an area of a main surface of the first back surface portion when the main surface of the first back surface portion is viewed from a direction perpendicular to the main surface of the first back surface portion, and fit within an area of a main surface of the first bottom surface portion when the main surface of the first bottom surface portion is viewed from a direction perpendicular to the main surface of the first bottom surface portion.

Advantageous Effects of Invention

The booster circuit according to the present disclosure can be easily manufactured and can prevent the occurrence of discharge.

DESCRIPTION OF EMBODIMENTS

Hereinafter, embodiments of a booster circuit and a voltage generator according to the present disclosure will be described in detail with reference to the drawings. In the following description, a Cockcroft-Walton circuit, which is an example of the booster circuit included in the voltage generator, is referred to as a CW circuit.

First Embodiment

Figure 1:
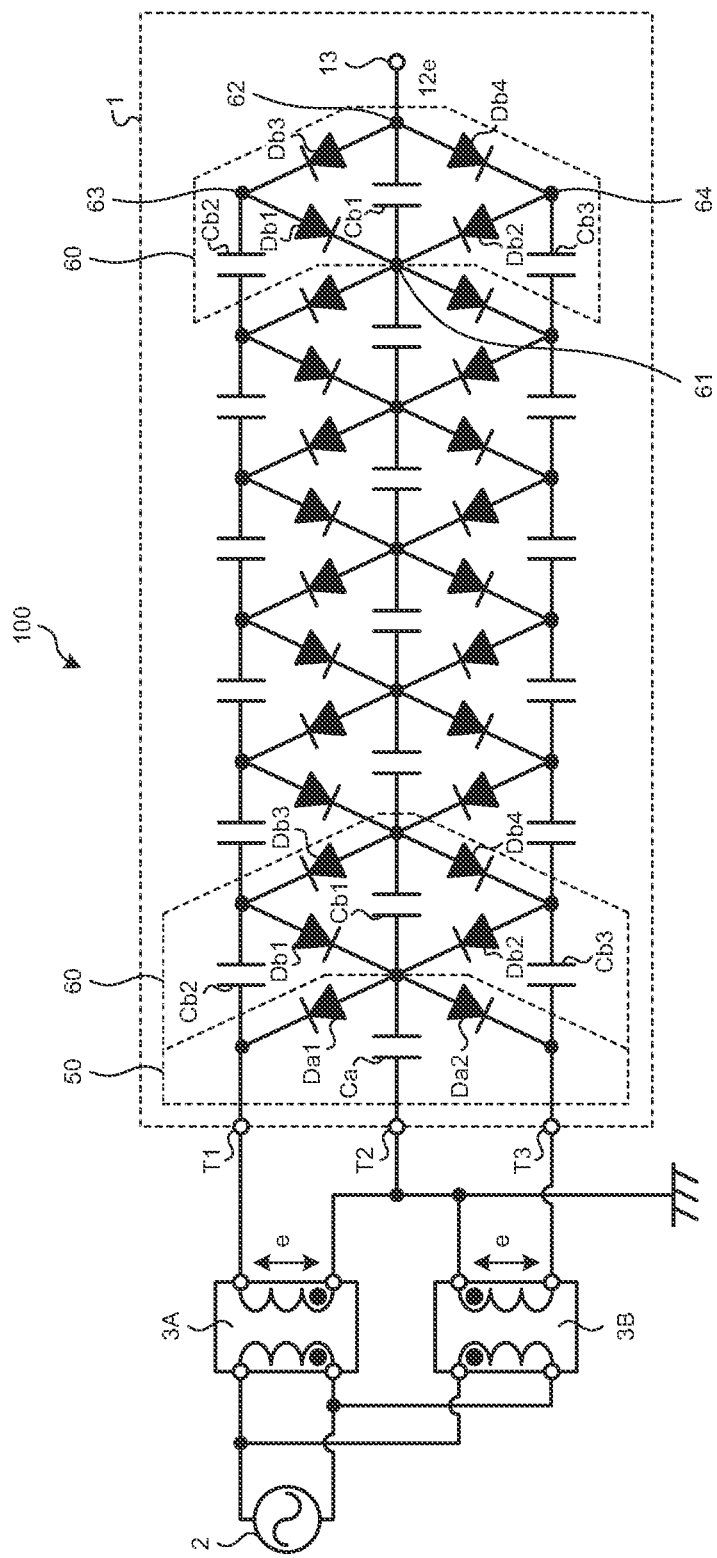
FIG. 1 is a diagram illustrating a configuration of a CW circuit included in a voltage generator according to a first embodiment.

FIG. 1 is a diagram illustrating a configuration of a CW circuit included in a voltage generator according to a first embodiment. A voltage generator 100 that is a direct current high voltage generator includes a CW circuit 1 that is a booster circuit, step-up transformers 3A and 3B, and an inverter circuit 2 that generates an alternating current voltage. Here, a case where the CW circuit 1 is a symmetric inverse CW circuit will be described.

The voltage generator 100 generates a voltage of several tens of kV to several hundreds of kV using the CW circuit 1, for example. A direct current high voltage generated by the voltage generator 100 is used, for example, when an electron beam machine that performs machining by irradiating an object with an electron beam accelerates the electron beam. The direct current high voltage generated by the voltage generator 100 may also be applied to an electron gun, an ion beam generator, an electron microscope, or the like.

The CW circuit 1 is a multi-stage voltage doubler rectifier circuit. While each component of the CW circuit 1 is a component having a low withstand voltage, the CW circuit 1 boosts the voltage to output a high voltage from a final output part 13, so that the voltage on the CW circuit 1 increases as it nears the final output part 13. Note that a boosting method, a boosting ratio, a voltage value, and the like of the CW circuit 1 described here are examples. The CW circuit 1 may be a CW circuit employing any boosting method.

The symmetric inverse CW circuit 1 is connected to the two step-up transformers 3A and 3B connected to the inverter circuit 2. The inverter circuit 2 is a full bridge inverter including a switching element such as an insulated gate bipolar transistor (IGBT) or a metal-oxide-semiconductor field-effect transistor (MOSFET). The inverter circuit 2 is driven at a frequency on the order of kHz.

The step-up transformers 3A and 3B step up the output of the inverter circuit 2 from minus several kV to minus several tens of kV (for example, −10 kV). The step-up transformers 3A and 3B each include a primary winding and a secondary winding, and the secondary windings of the step-up transformers 3A and 3B are connected in series with each other. The polarities of the windings of the step-up transformers 3A and 3B are indicated by black dots. The secondary windings of the step-up transformers 3A and 3B are connected to each other on the side of the black dots.

Both terminals of the secondary winding of the step-up transformer 3A serve as input terminals T1 and T2 of the CW circuit 1. Both terminals of the secondary winding of the step-up transformer 3B serve as input terminals T2 and T3 of the CW circuit 1. The input terminal T2 is connected to a fixed potential.

The CW circuit 1 includes a plurality of diodes and a plurality of capacitors. Specifically, the CW circuit 1 includes a rectifier circuit unit 50 and a voltage doubler booster circuit unit 60. The rectifier circuit unit 50 includes a direct current capacitor Ca and diodes Da1 and Da2, and the voltage doubler booster circuit unit 60 includes a direct current capacitor Cb1, alternating current capacitors Cb2 and Cb3, and diodes Db1 to Db4.

In the inverse CW circuit 1, a first capacitor and a first diode when viewed from an input side are omitted, and thus the circuit of a first stage simply forms the rectifier circuit unit 50. The rectifier circuit unit 50 is connected to the input terminals T1 to T3, and the voltage doubler booster circuit unit 60 is connected to the rectifier circuit unit 50 and the final output part 13. In the rectifier circuit unit 50, the direct current capacitor Ca is connected to the input terminal T2, a cathode of the diode Da1 is connected to the input terminal T1, and a cathode of the diode Da2 is connected to the input terminal T3.

In the CW circuit 1, a plurality of the voltage doubler booster circuit units 60 are connected in stages to the rectifier circuit unit 50. That is, in the CW circuit 1, the plurality of the voltage doubler booster circuit units 60 each including the direct current capacitor Cb1, the alternating current capacitors Cb2 and Cb3, and the diodes Db1 to Db4 are connected in stages to the direct current capacitor Ca and the diodes Da1 and Da2 included in the rectifier circuit unit 50. This configuration makes the CW circuit 1 the multi-stage voltage doubler rectifier circuit. The capacitance of the direct current capacitor Ca of the rectifier circuit unit 50 is set to be twice the capacitance of the direct current capacitor Cb1 included in the voltage doubler booster circuit unit 60.

Assuming that the voltage doubler booster circuit unit 60 of an N-th stage (where "N" is a natural number) among the voltage doubler booster circuit units 60 is denoted as a voltage doubler booster circuit unit 60-N, the voltage doubler booster circuit unit 60-N and a voltage doubler booster circuit unit 60-(N-1) are connected. Here, a configuration of the voltage doubler booster circuit unit 60-N will be described in a case where the voltage doubler booster circuit unit 60-N is disposed on the side closer to the final output part 13.

In the voltage doubler booster circuit unit 60-N that is a unit circuit, a cathode of the diode Db1 and a cathode of the diode Db2 are connected at a connection point 61. Moreover, an anode of the diode Db3 and an anode of the diode Db4 are connected at a connection point 62.

In addition, an anode of the diode Db1 and a cathode of the diode Db3 are connected at a connection point 63, and an anode of the diode Db2 and a cathode of the diode Db4 are connected at a connection point 64. The direct current capacitor Cb1 is connected to the connection point 61 and the connection point 62.

The alternating current capacitor Cb2 of the voltage doubler booster circuit unit 60-N is connected to the connection point 63 of the voltage doubler booster circuit unit 60-N and the connection point 63 of the voltage doubler booster circuit unit 60-(N-1). The alternating current capacitor Cb3 of the voltage doubler booster circuit unit 60-N is connected to the connection point 64 of the voltage doubler booster circuit unit 60-N and the connection point 64 of the voltage doubler booster circuit unit 60-(N-1). The connection point 61 of the voltage doubler booster circuit unit 60-N is the connection point 62 of the voltage doubler booster circuit unit 60-(N-1).

The voltage doubler booster circuit unit 60 of a first stage is connected to the voltage doubler booster circuit unit 60 of a second stage and the rectifier circuit unit 50. In the voltage doubler booster circuit unit 60 of the first stage, the alternating current capacitor Cb2 is connected to the input terminal T1 and the cathode of the diode Da1, and the alternating current capacitor Cb3 is connected to the input terminal T3 and the cathode of the diode Da2. Also, in the voltage doubler booster circuit unit 60 of the first stage, the connection point 61 is connected to the direct current capacitor Ca.

The voltage that the CW circuit 1 outputs from the final output part 13 is used as, for example, a high voltage for electron beam generation. At this time, a voltage V output from the final output part 13 is expressed as $V=(2n-1)e$, where "e" is a peak value of the output voltage of the step-up transformers 3A and 3B. Here, "n" represents the number of series of the voltage doubler booster circuit units 60. FIG. 1 illustrates a case where the total number of series of the voltage doubler booster circuit units 60 is six and a half, and the CW circuit 1 is a 12-fold booster circuit.

Figure 2:
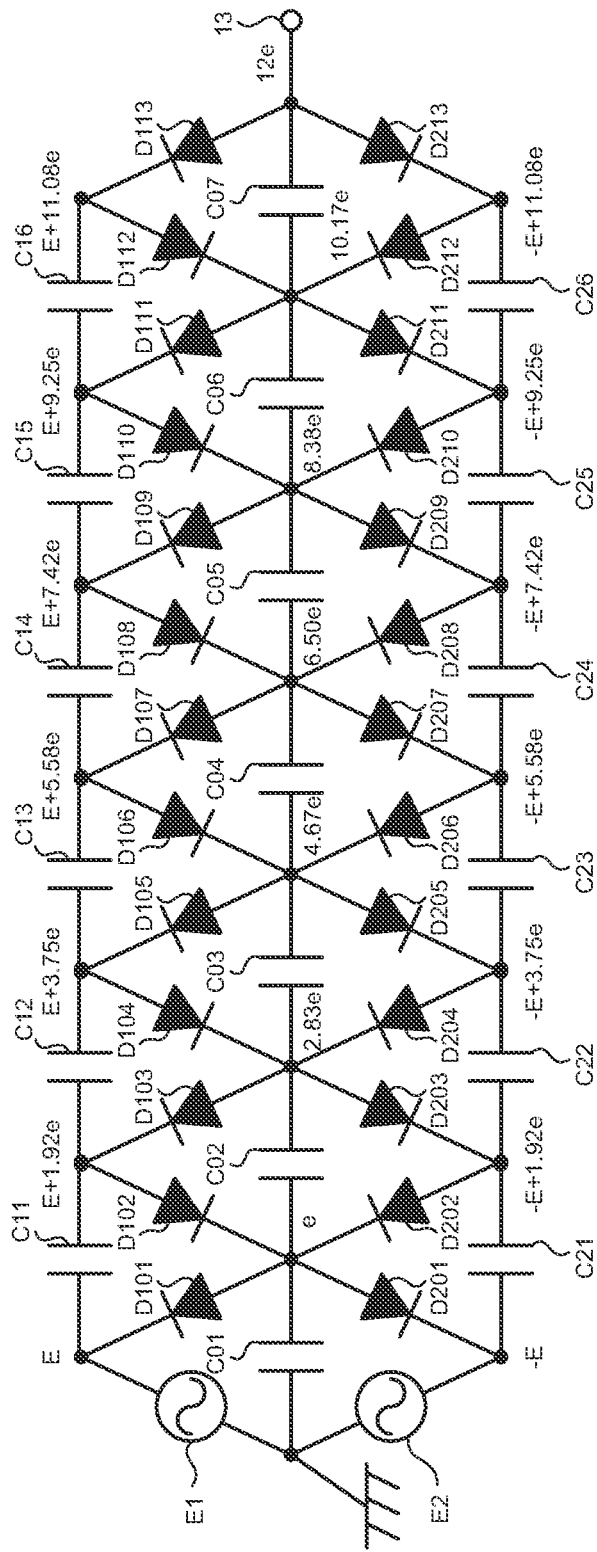
FIG. 2 is a diagram for explaining the operating principle of the CW circuit included in the voltage generator according to the first embodiment.

Next, the operating principle of the CW circuit 1 will be described. FIG. 2 is a diagram for explaining the operating principle of the CW circuit included in the voltage generator according to the first embodiment. In FIG. 2, the diodes Db1 and Db3 in the CW circuit 1 are indicated by diodes D102, D103, . . . , and D113 in order from the voltage input side, and the diodes Db2 and Db4 in the CW circuit 1 are indicated by diodes D202, D203, . . . , and D213 in order from the voltage input side. Moreover, the direct current capacitors Cb1 in the CW circuit 1 are indicated by direct current capacitors C02, C03, . . . , and C07 in order from the voltage input side. In addition, the alternating current capacitors Cb2 in the CW circuit 1 are indicated by alternating current capacitors C11, C12, . . . , and C16 in order from the voltage input side, and the alternating current capacitors Cb3 in the CW circuit 1 are indicated by alternating current capacitors C21, C22, . . . , and C26 in order from the voltage input side.

Moreover, the diodes Da1 and Da2 of the rectifier circuit unit 50 are indicated by diodes D101 and D201, respectively, and the direct current capacitor Ca is indicated by a direct current capacitor C01. Note that in FIG. 2, voltage values written next to the connection points in the CW circuit 1 are voltage values at the connection points.

Alternating current power supplies E1 and E2 generate sinusoidal voltages $E(=e\sin\omega t)$ and $-E(=-e\sin\omega t)$ having the same peak value ($=e$) and the phases different from each other by 180 degrees, respectively. The peak value "e" is a negative value.

At the time when the alternating current power supply E1 generates the highest voltage "e", the direct current capacitor C01 is charged to the voltage "e" via the diode D101. At this time, since the alternating current 10 power supply E2 generates −0.92 e, the alternating current capacitor C21 is charged to 1.92 e via the diodes D101 and D202.

When the alternating current power supply E2 generates the voltage "e" the next time, the potential of the high-voltage terminal of the alternating current capacitor C21 equals 2.92 e. With this potential, the direct current capacitors C01 and C02 connected in series are charged to a voltage of 2.92 e via the diode D203. At the same time, the alternating current capacitors C11 and C12 connected in series are charged to a voltage of 2.83 e via the diodes D203 and D104. When the alternating current power supply E1 generates the voltage "e" again, the direct current capacitors C01, C02, and C03 connected in series in the next stage are charged to a voltage of 4.67 e via the diode D105. Such capacitor charging is repeated in the CW circuit 1, and the output of the last stage from the final output part 13 equals a voltage of 12 e.

The reason why the capacitance of only the direct current capacitor C01 is set twice (2C) the capacitance of the other direct current capacitors is to prevent the occurrence of a surge. For example, when rapid discharge occurs in the direct current capacitors C01 to C07 by dielectric breakdown of a load, the discharge amounts of the direct current capacitors C01 to C07 connected in series are all equal, and thus the voltage across the direct current capacitors C01 to C07 all equals "e", and for the rest the voltage equals 2 e. Therefore, by setting the capacitance of only the direct current capacitor C01 in the first stage to 2 C, the amount of charge in normal time all equals 2 eC. As a result, even when rapid discharge occurs, the terminal voltages of the direct current capacitors C01 to C07 all equal zero with no anomaly, and the occurrence of a surge voltage is prevented.

Figure 3:
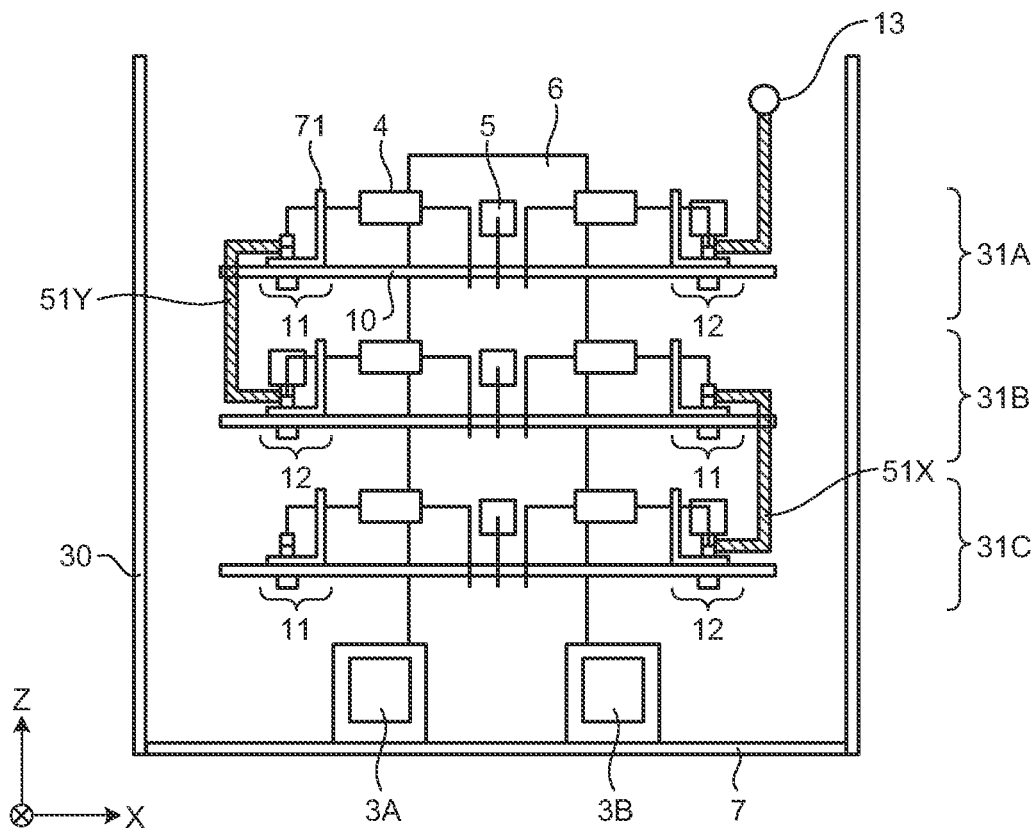
FIG. 3 is a diagram illustrating an implementation structure of the CW circuit included in the voltage generator according to the first embodiment.

Next, an implementation structure of the CW circuit 1 will be described. FIG. 3 is a diagram illustrating the implementation structure of the CW circuit included in the voltage generator according to the first embodiment. FIG. 3 illustrates a cross-sectional view taken along a plane including a cylinder axis of a cylindrical outer peripheral container 30 in which a CW circuit 1 is disposed. Two axes that are in a plane parallel to upper surfaces of plate-shaped stages 31A to 31C and are orthogonal to each other are defined as an X axis and a Y axis. Moreover, an axis orthogonal to the X axis and the Y axis is defined as a Z axis. Note that in the following description, a side corresponding to a bottom surface of the outer peripheral container 30 may be referred to as a lower side, and a side on which the stage 31A is disposed may be referred to as an upper side.

The CW circuit 1 of the voltage generator 100 is disposed in the cylindrical outer peripheral container 30 installed. A base plate 7 is provided at a bottom portion of the outer peripheral container 30, and the two step-up transformers 3A and 3B are disposed on an upper surface of the base plate 7. Note that although the outer peripheral container 30 is filled with air, in order to improve the insulation tolerance, the outer peripheral container 30 may be formed as a sealed case and may be filled with dry air, nitrogen, hydrogen, or sulfur hexafluoride. That is, the atmosphere environment where the insulating substrate 10 on which the CW circuit 1 is formed is disposed may be filled with dry air, nitrogen, hydrogen, or sulfur hexafluoride.

In the outer peripheral container 30, a plurality of stages are disposed above the step-up transformers 3A and 3B. FIG. 3 illustrates a case where three stages 31A, 31B, and 31C are stacked at equal intervals in the outer peripheral container 30. The stage 31C is a first stage from the bottom, the stage 31B is a second stage from the bottom, and the stage 31A is a third stage from the bottom.

The stages 31A to 31C and the base plate 7 are disposed such that upper and lower surfaces thereof are parallel to one another. FIG. 3 illustrates a case where the stage 31C is disposed above the base plate 7, the stage 31B is disposed above the stage 31C, and the stage 31A is disposed above the stage 31B.

Connection lines 51X and 51Y are wirings that connect the insulating substrates 10. The step-up transformers 3A and 3B are electrically connected to the stage 31C. The stage 31C is electrically connected to the stage 31B via a connection line 51X, and the stage 31B is electrically connected to the stage 31A via a connection line 51Y. Note that FIG. 3 omits the illustration of a connection line between the step-up transformers 3A and 3B and a connection line between the step-up transformers 3A and 3B and the stage 31C.

The stages 31A, 31B, and 31C are each configured using the plate-shaped insulating substrate 10. A lower surface of the insulating substrate 10 of the stage 31A faces an upper surface of the insulating substrate 10 of the stage 31B, and a lower surface of the insulating substrate 10 of the stage 31B faces an upper surface of the insulating substrate 10 of the stage 31C.

In the outer peripheral container 30, the output voltages from the step-up transformers 3A and 3B are stepped up in stages in the stage 31C, the stage 31B, and the stage 31A in this order, and are output from a final output part 13.

Each of the stages 31A to 31C forming the CW circuit 1 is provided with an input part 11 and an output part 12 that connect the stages. The input part 11 and the output part 12 are disposed at substrate ends of the insulating substrate 10. The input part 11 receives a voltage from the insulating substrate 10 on the lower side, and the output part 12 outputs the voltage stepped up by the CW circuit 1 to the insulating substrate 10 on the upper side.

The output part 12 of the stage 31C and the input part 11 of the stage 31B are provided at connection points with the connection line 51X. The output part 12 of the stage 31B and the input part 11 of the stage 31A are provided at connection points with the connection line 51Y.

In the CW circuit 1, the output part 12 of the stage 31C and the input part 11 of the stage 31B are electrically connected, and the output part 12 of the stage 31B and the input part 11 of the stage 31A are electrically connected.

The stages 31A to 31C being electrically connected are stacked at equal intervals as described above, whereby a stepped-up direct current high voltage is output from the final output part 13 of the uppermost stage 31A. The stages 31A to 31C may be stacked with a resin spacer interposed therebetween, or may be stacked by being fixed with bolts or the like via a column 6 across the stages. The column 6 may be a part of the outer peripheral container 30 as illustrated in FIG. 3, or may be formed separately from the outer peripheral container 30.

In the first embodiment, a metal fitting formed by bending a thin plate member into an L shape (hereinafter referred to as an L-shaped joint fitting 71) is disposed at each of the input part 11 and the output part 12 of the stages 31A to 31C, from which discharge is likely to originate, whereby the occurrence of discharge is prevented. The L-shaped joint fitting 71 is a conductive L-shaped joint fitting fixed to the insulating substrate 10.

Figure 4:
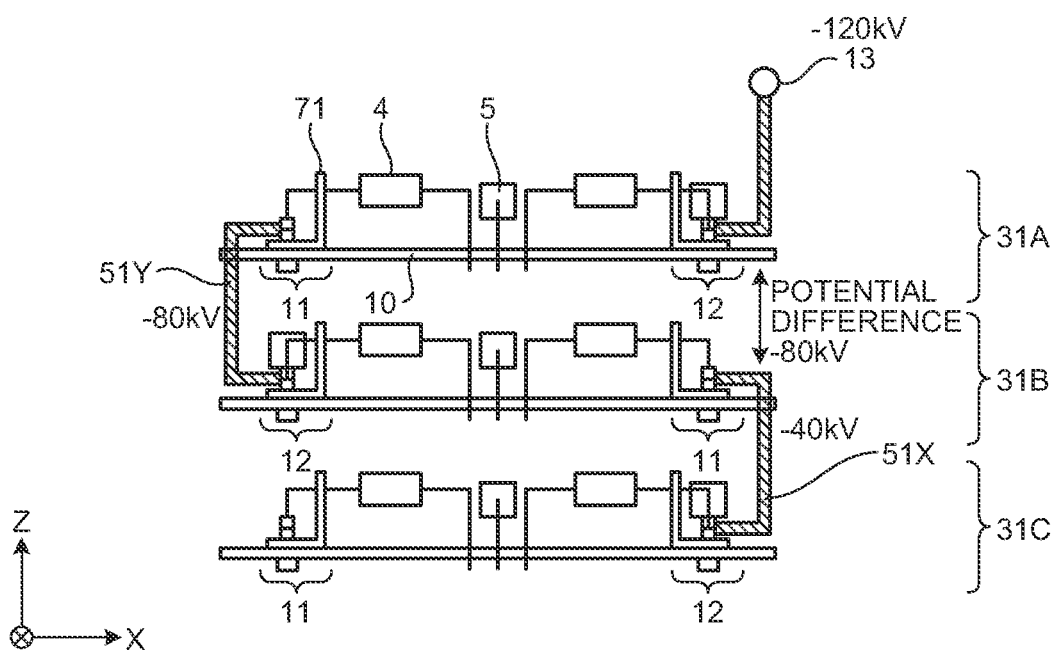
FIG. 4 is a diagram for explaining a potential difference between stages of the CW circuit included in the voltage generator according to the first embodiment.

A potential difference between the stages will be described. FIG. 4 is a diagram for explaining the potential difference between the stages of the CW circuit included in the voltage generator according to the first embodiment. Here, there will be described the potential difference between the stages in a case where an input voltage to the CW circuit 1 is stepped up to ±10 kV, that is, an output of the full bridge inverter is stepped up to ±10 kV by the step-up transformers 3A and 3B.

In the case where the input voltage to the CW circuit 1 is ±10 kV, the output voltage in the third stage reaches −120 kV when the voltage is stepped up by about −40 kV per stage. As illustrated in FIG. 4, there is a place with a potential difference of up to −80 kV between the stages. For example, the potential difference between −40 kV at the input part 11 of the stage 31B as the second stage and −120 kV at the output part 12 of the stage 31A as the third stage is −80 kV. Since the stages 31A to 31C are stacked at equal intervals, it can be said that the place with the maximum potential difference is the place where discharge is most likely to occur. Thus, since the stages 31A to 31C are stacked at equal intervals, the potential difference is the maximum between the input part 11 of one of the stages and the output part 12 of another one of the stages. That is, it can be said that discharge is most likely to occur between the input part 11 of one of the stages and the output part 12 of another one of the stages.

Here, discharge will be described. A likelihood of discharge depends on magnitude of an electric field, and the magnitude of the electric field discharged in air is about 3 kV/rm. The magnitude of the electric field is determined by a potential difference between two points, which correspond to places where discharge is likely to occur (hereinafter referred to as discharge candidates), a distance between the two points, and outer shapes of the two points. However, in a case where the two points as the discharge candidates are both infinite parallel plates, the electric field is determined only by the potential difference and the distance. This state of space is called a uniform electric field.

On the other hand, in a case where the two points as the discharge candidates are not infinite parallel plates but protrusions (for example, needles), the magnitude of the electric field is determined by the potential difference between the two points as the discharge candidates, the distance between the two points, and the outer shapes. In a case where the potential difference and the distance are fixed, the electric field increases with an increase in acuteness of the outer shapes of the two points as the discharge candidates, and the electric field decreases as the outer shapes approximate a sphere. This state of space is called a non-uniform electric field.

In a case where the potential difference is fixed, it is necessary to increase the distance between the two points as the discharge candidates or to appropriately design the outer shapes of the two points in order to prevent the occurrence of discharge. However, simply increasing the distance results in an increase in size of the voltage generator. Therefore, in the first embodiment, the distance between the two points is reduced by appropriately designing the outer shape of at least one of the two points as the discharge candidates. That is, in the CW circuit 1, the distance between the stages is reduced.

The input part 11 and the output part 12 of the stages 31A to 31C are disposed at the substrate ends, that is, ends of the insulating substrate 10. In the voltage generator 100 according to the first embodiment, the L-shaped joint fittings 71 are disposed for the input part 11 and output part 12, so that the occurrence of discharge at the input part 11 and the output part 12 is prevented.

Figure 5:
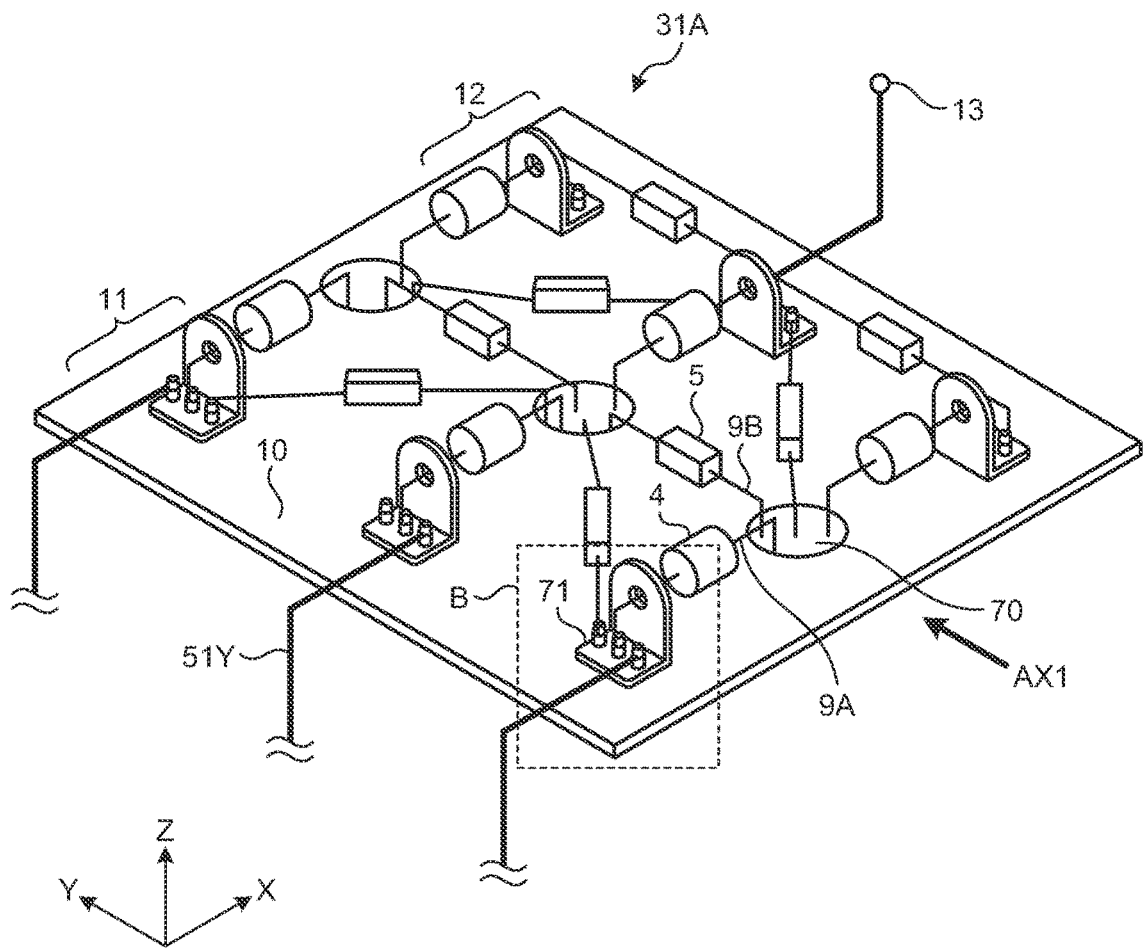
FIG. 5 is a perspective view illustrating a structure of the stage included in the voltage generator according to the first embodiment.
Figure 6:
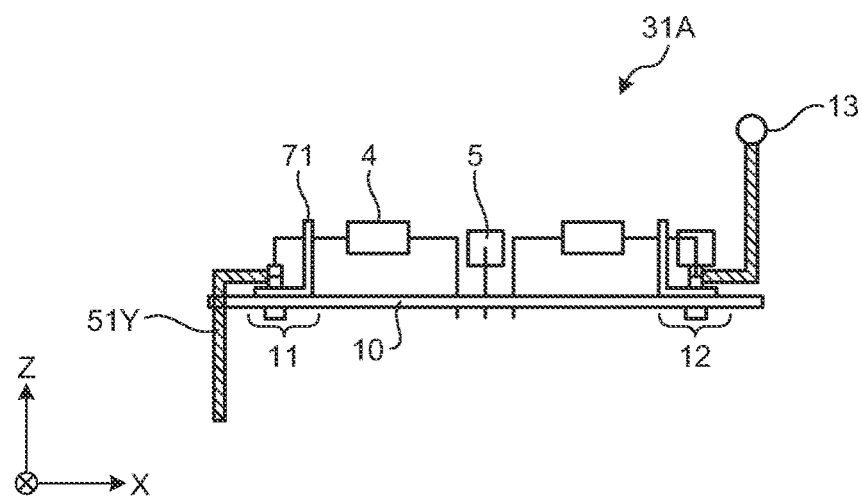
FIG. 6 is a side view illustrating a structure of the stage included in the voltage generator according to the first embodiment.

FIG. 5 is a perspective view illustrating a structure of the stage included in the voltage generator according to the first embodiment. FIG. 6 is a side view illustrating the structure of the stage included in the voltage generator according to the first embodiment. FIGS. 5 and 6 illustrate the structure for one stage. Note that since the stages 31A to 31C have similar structures, the structure of the stage 31A will be described here. FIG. 6 illustrates the structure of the stage 31A when the stage 31A is viewed from a direction indicated by "AX1" in FIG. 5.

The stage 31A includes the insulating substrate 10, capacitors 4, diodes 5, and the L-shaped joint fittings 71. Note that an example of the insulating substrate 10 is a printed circuit board. The example of FIG. 5 illustrates a case where a plurality of the capacitors 4, a plurality of the diodes 5, and a plurality of the L-shaped joint fittings 71 are disposed on the insulating substrate 10.

In the voltage generator 100, the insulating substrate 10 on which components such as the capacitors 4, the diodes 5, and the L-shaped joint fittings 71 are mounted is fixed to the column 6, thereby forming the CW circuit 1 as a booster circuit. Note that although FIG. 5 illustrates the positions where the capacitors 4, the diodes 5, and the L-shaped joint fittings 71 are disposed, the positions where the capacitors 4, the diodes 5, and the L-shaped joint fittings 71 are disposed are not limited to those illustrated in FIG. 5.

In a conductive pattern portion 70 that is a component connecting portion for a lead 9A of the capacitor 4 and a lead 9B of the diode 5, a through hole is formed from an upper surface side to a lower surface side of the insulating substrate 10.

The lead 9A of the capacitor 4 and the lead 9B of the diode 5 are bent (lead-formed) toward the insulating substrate 10, passed through the through hole from the upper surface side of the insulating substrate 10, and drawn out to the lower surface side of the insulating substrate 10. A conductive pattern is disposed around the through hole on the lower surface of the insulating substrate 10, and the lead 9A of the capacitor 4, the lead 9B of the diode 5, and the conductive pattern of the insulating substrate 10 are electrically connected by solder.

On the other hand, the L-shaped joint fitting 71 is disposed at a component connecting portion for each of the input part 11 and the output part 12 of the stage 31A. At the component connecting portion for each of the input part 11 and the output part 12, the lead 9A of the capacitor 4, the lead 9B of the diode 5, the connection line 51Y, and the conductive pattern of the insulating substrate 10 are electrically connected by the L-shaped joint fitting 71. Therefore, the component connecting portion for each of the input part 11 and the output part 12 is positioned on the L-shaped joint fitting 71. The component connecting portion for each of the input part 11 and the output part 12 is a first component connecting portion.

Among the leads 9A, the lead 9A connected to the first component connecting portion is a first lead, and among the leads 9B, the lead 9B connected to the first component connecting portion is a second lead.

Among the capacitors 4, the capacitor 4 disposed at the substrate end and connected to the input part 11 or the output part 12 at the component connecting portion is a first capacitor. Among the diodes 5, the diode 5 disposed at the substrate end and connected to the input part 11 or the output part 12 at the component connecting portion is a first diode.

Figure 7:
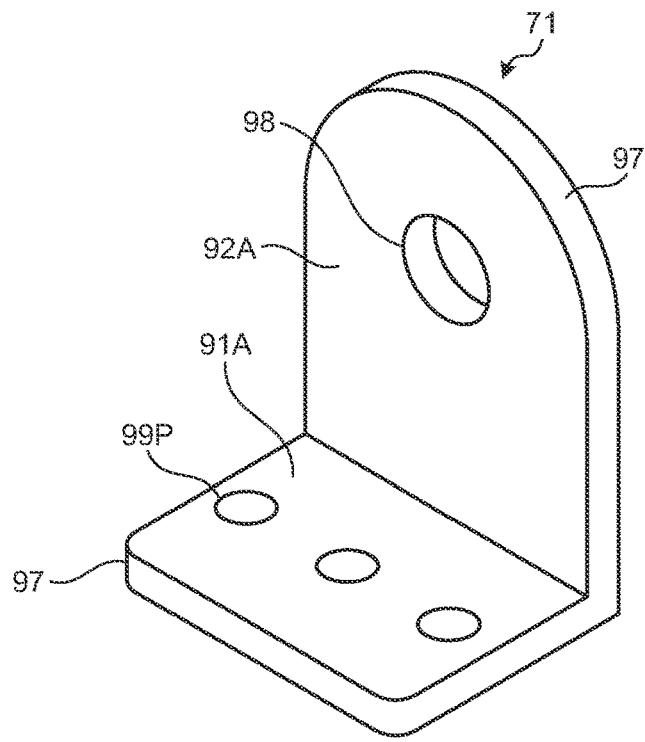
FIG. 7 is a perspective view illustrating a structure of an L-shaped joint fitting included in the voltage generator according to the first embodiment.

Here, the L-shaped joint fitting 71 will be described. FIG. 7 is a perspective view illustrating a structure of the L-shaped joint fitting included in the voltage generator according to the first embodiment. The L-shaped joint fitting 71 is a metal fitting having an L-shaped cross section formed by bending one end of a conductive thin plate member (such as aluminum or copper) upward. The L-shaped joint fitting 71 includes a plate-shaped bottom surface portion 91A that is a first bottom surface portion, and a plate-shaped back surface portion 92A that is a first back surface portion bent upward.

The bottom surface portion 91A of the L-shaped joint fitting 71 is attached to the insulating substrate 10. The back surface portion 92A extends perpendicularly from the bottom surface portion 91A, and has one main surface facing the outside of the insulating substrate 10.

Moreover, the L-shaped joint fitting 71 includes bolt through holes 99P through which bolts can pass in the bottom surface portion 91A, and includes a lead through hole 98 through which the lead 9A can pass in the back surface portion 92A.

Note that the L-shaped joint fitting 71 does not necessarily have to be formed by bending the thin plate member at a right angle. Also, the L-shaped joint fitting 71 may be formed of one thin plate member, or may be formed by combining a plurality of thin plate members.

The bolt hole diameter and position of the bolt through hole 99P in the bottom surface portion 91A may be set to any dimension and position. Likewise, the lead hole diameter and position of the lead through hole 98 in the back surface portion 92A may be set to any dimension and position.

Since the L-shaped joint fitting 71 is easily discharged when there is a protrusion on an outer periphery of the L-shaped joint fitting 71, in order to relax the electric field on the outer periphery, an edge 97 of the bottom surface portion 91A and the back surface portion 92A is subjected to edge processing so as to be rounded.

Moreover, in the L-shaped joint fitting 71, the rim of the outer periphery of the L-shaped joint fitting 71 is chamfered. Note that chamfering is preferably radius (R) chamfering in order to minimize the size of the protrusion.

The L-shaped joint fitting 71 can be manufactured only by bending, drilling, edge processing, and chamfering of the thin plate member with no need for special processing, and thus disposing the L-shaped joint fitting 71 does not significantly increase the manufacturing cost of the voltage generator 100.

Figure 8:
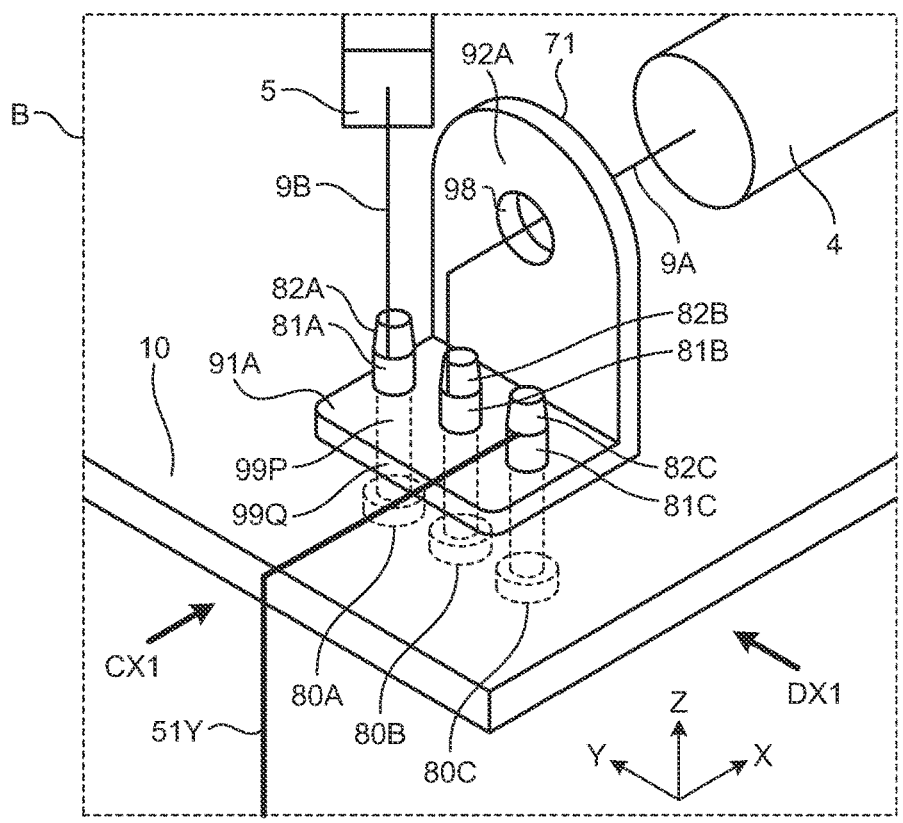
FIG. 8 is a diagram for explaining a configuration of the L-shaped joint fitting attached to the stage included in the voltage generator according to the first embodiment.
Figure 9:
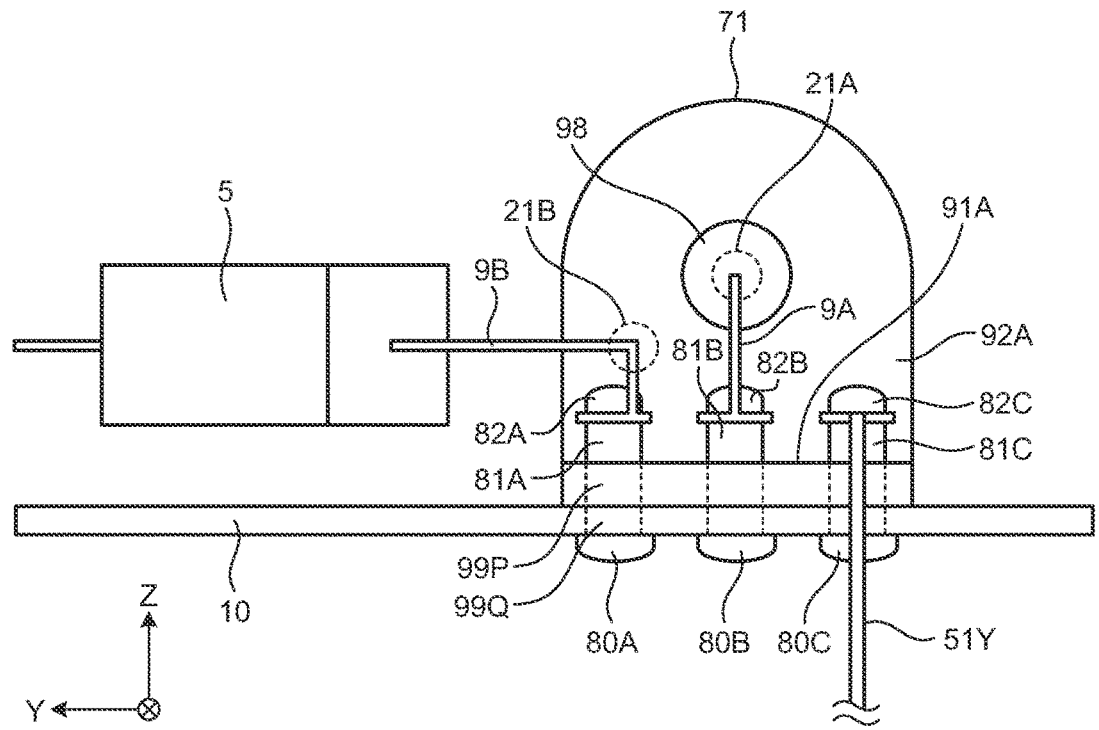
FIG. 9 is a diagram for explaining a method of connecting a bottom surface portion and a diode illustrated in FIG. 8.
Figure 10:
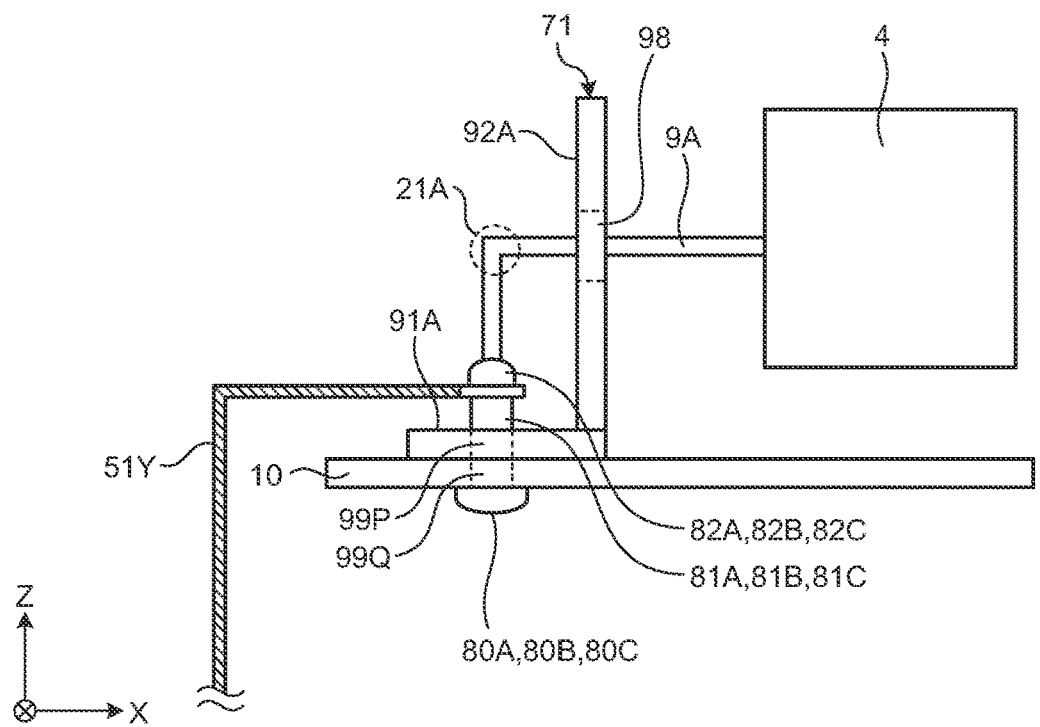
FIG. 10 is a diagram for explaining a method of connecting a back surface portion and a capacitor illustrated in FIG. 8.

FIG. 8 is a diagram for explaining a configuration of the L-shaped joint fitting attached to the stage included in the voltage generator according to the first embodiment. Note that FIG. 8 is an enlarged portion B for the L-shaped joint fitting 71 illustrated in FIG. 5. FIG. 9 is a diagram for explaining a method of connecting the bottom surface portion and the diode illustrated in FIG. 8. FIG. 10 is a diagram for explaining a method of connecting the back surface portion and the capacitor illustrated in FIG. 8.

FIG. 8 illustrates a perspective view of the L-shaped joint fitting 71 attached to the stage 31A. FIG. 9 illustrates a structure of the L-shaped joint fitting 71 when the L-shaped joint fitting 71 is viewed from a CX1 direction in FIG. 8. That is, FIG. 9 illustrates a diagram in which the L-shaped joint fitting 71 is viewed from the front. FIG. 10 illustrates a structure of the L-shaped joint fitting 71 when the L-shaped joint fitting 71 is viewed from a DX1 direction in FIG. 8. That is, FIG. 10 illustrates a diagram in which the L-shaped joint fitting 71 is viewed from a side.

Bolts are passed through the bolt through holes 99P formed in the bottom surface portion 91A and bolt through holes 99Q formed in the insulating substrate 10, and nuts are screwed onto the bolts, whereby the L-shaped joint fitting 71 is fixed to the insulating substrate 10. Note that the bolts and the nuts are made of conductive material. In the example of FIG. 8, bolts 80A, 80B, and 80C are passed through the bolt through holes 99P formed in the bottom surface portion 91A and the bolt through holes 99Q formed in the insulating substrate 10. The bolt 80A is fixed by a fixing nut 81A, the bolt 80B is fixed by a fixing nut 81B, and the bolt 80C is fixed by a fixing nut 81C.

FIG. 9 will be used to describe a method of connecting the bottom surface portion 91A of the L-shaped joint fitting 71, the diode 5, and the connection line 51Y to the insulating substrate 10. In the insulating substrate 10, the bolts 80A and 80C are passed through the bolt through holes 99P and 99Q, and the bolts 80A and 80C are fixed by the fixing nuts 81A and 81C, respectively. Covering nuts 82A and 82C are further provided at tip portions of screw portions of the bolts 80A and 80C, respectively.

The lead 9B of the diode 5 is lead-formed in the direction of the bottom surface portion 91A, a tip portion of the lead 9B is sandwiched between the fixing nut 81A and the covering nut 82A, and the fixing nut 81A and the covering nut 82A are fastened. As a result, the diode 5 is electrically connected to the L-shaped joint fitting 71.

Moreover, a tip portion of the connection line 51Y is sandwiched between the fixing nut 81C and the covering nut 82C, and the fixing nut 81C and the covering nut 82C are fastened. As a result, the connection line 51Y is electrically connected to the L-shaped joint fitting 71.

In FIG. 9, a lead forming portion that is a bent portion of the lead 9A is illustrated as a lead forming portion 21A, and a lead forming portion that is a bent portion of the lead 9B is illustrated as a lead forming portion 21B. The lead forming portion 21A connected to the L-shaped joint fitting 71 is a first lead forming portion, and the lead forming portion 21B connected to the L-shaped joint fitting 71 is a second lead forming portion. Hereinafter, in a case where the lead forming portions 21A and 21B do not need to be distinguished, the lead forming portions 21A and 21B may be referred to as a lead forming portion 21.

FIG. 10 will be used to describe a method of connecting the bottom surface portion 91A of the L-shaped joint fitting 71 and the capacitor 4 to the insulating substrate 10. In the insulating substrate 10, the bolt 80B is passed through the bolt through holes 99P and 99Q, and the bolt 80B is fixed by the fixing nut 81B. A covering nut 82B is further provided at a tip portion of a screw portion of the bolt 80B.

The lead 9A of the capacitor 4 is passed through the lead through hole 98 in the back surface portion 92A and lead-formed in the direction of the bottom surface portion 91A, a tip portion of the lead 9A is sandwiched between the fixing nut 81B and the covering nut 82B, and the fixing nut 81B and the covering nut 82B are fastened. As a result, the capacitor 4 is electrically connected to the L-shaped joint fitting 71.

As described above, the connection between components being the capacitor 4, the diode 5, and the connection line 51Y and the L-shaped joint fitting 71 is achieved by fixing using only the bolts and the nuts, so that soldering work is unnecessary.

In addition, when the L-shaped joint fitting 71 is L-shaped and disposed with the inner side of the L-shaped joint fitting 71 facing the outside of the insulating substrate 10, fastening work of the bolts 80A to 80C is facilitated. That is, when the L-shaped joint fitting 71 is disposed such that the bottom surface portion 91A of the L-shaped joint fitting 71 is closer to the outside of the insulating substrate 10 than the back surface portion 92A is, fastening work of the bolts 80A to 80C is facilitated. As a result, ease of assembly of the voltage generator 100 can be improved. Note that ease of assembly can be further improved by providing crimp terminals at the tip portion of the lead 9A of the capacitor 4, the tip portion of the lead 9B of the diode 5, and the tip portion of the connection line 51Y.

Figure 11:
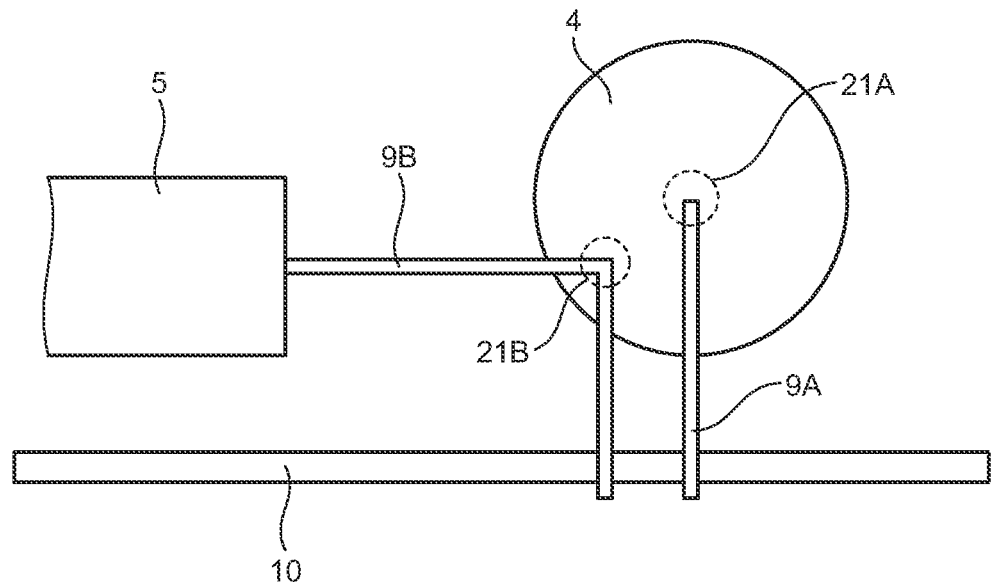
FIG. 11 is a diagram for explaining an implementation structure of components of a stage included in a voltage generator of a comparative example.

Here, areas where discharge is likely to occur on the stages 31A to 31C in the voltage generator 100 will be described. FIG. 11 is a diagram for explaining an implementation structure of components of a stage included in a voltage generator of a comparative example. The voltage generator of the comparative example does not include the L-shaped joint fitting 71.

In the voltage generator of the comparative example, the lead 9A of the capacitor 4 and the lead 9B of the diode 5 are passed through through holes from the upper surface side of the insulating substrate 10 and are drawn out to the lower surface side of the insulating substrate 10. Then, the leads 9A and 9B are soldered on the lower surface of the insulating substrate 10, whereby the capacitor 4 and the diode 5 are bonded to the insulating substrate 10.

Although discharge is less likely to occur from the body of the diode 5 covered with an insulator resin and the body of the capacitor 4 covered with an insulator resin because the bodies are the insulators, discharge is likely to occur from the leads 9A and 9B that are conductors. Also, when the capacitor 4 and the diode 5 are mounted on the insulating substrate 10, the component connecting portion with the insulating substrate 10 and the lead forming portions 21A and 21B that are bent portions of the leads 9A and 9B may have protrusions (acute angles). In the voltage generator of the comparative example, the lead forming portions 21A and 21B can be protrusions and are likely to cause a high electric field as the L-shaped joint fitting 71 is not included.

On the other hand, in the voltage generator 100 of the first embodiment, as illustrated in FIGS. 9 and 10, the component connecting portion for the capacitor 4 and the diode 5 and the lead forming portion 21 of each of the leads 9A and 9B, in which electric field concentration is likely to occur, are contained in the L-shaped joint fitting 71 as viewed from the outside of the insulating substrate 10. Specifically, in the voltage generator 100, when the main surface of the back surface portion 92A is viewed from a direction perpendicular to the main surface of the back surface portion 92A, the L-shaped joint fitting 71 is disposed such that the lead forming portion 21 and the component connecting portion of the L-shaped joint fitting 71 fit within the area of the main surface of the back surface portion 92A. Moreover, in the voltage generator 100, when the main surface of the bottom surface portion 91A is viewed from a direction perpendicular to the main surface of the bottom surface portion 91A, the L-shaped joint fitting 71 is disposed such that the lead forming portion 21 and the component connecting portion of the L-shaped joint fitting 71 fit within the area of the main surface of the bottom surface portion 91A. That is, in the voltage generator 100, the back surface portion 92A and the bottom surface portion 91A are disposed such that a part where electric field concentration is likely to occur can be projected onto the back surface portion 92A and the bottom surface portion 91A when viewed from the outside of the insulating substrate 10. In other words, in the voltage generator 100, when the component connecting portion and the lead forming portion 21 are viewed from the outside of the insulating substrate 10 such that the main surface (front surface or back surface) of the back surface portion 92A comes to the front, the component connecting portion and the lead forming portion 21 fit within the main surface of the back surface portion 92A. Moreover, in the voltage generator 100, when the component connecting portion and the lead forming portion 21 are viewed from the outside of the insulating substrate 10 such that the main surface (front surface or back surface) of the bottom surface portion 91A comes to the front, the component connecting portion and the lead forming portion 21 fit within the main surface of the bottom surface portion 91A.

Since the component connecting portion and the lead forming portion 21 have the same potential in the region contained in the L-shaped joint fitting 71, the electric field depends on the outer peripheral shape of the L-shaped joint fitting 71. That is, in the voltage generator 100, the electric field concentration does not occur at the protrusions of the component connecting portion and the lead forming portion 21, and thus discharge can be prevented.

Note that it is important for the L-shaped joint fitting 71 how the lead forming portion 21 can be projected by the back surface portion 92A of the L-shaped joint fitting 71. Therefore, the height dimension of the back surface portion 92A is desirably higher than the height positions of the component connecting portion and the lead forming portion 21. Also, for a similar reason, it is desirable that the component connecting portion and the lead forming portion 21 are closer to the back surface portion 92A in a horizontal direction of the lead forming portion 21.

Figure 12:
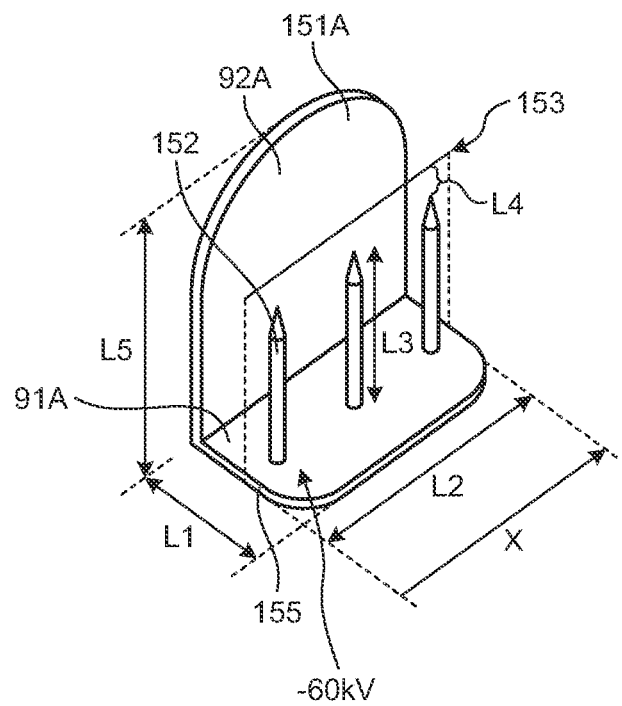
FIG. 12 is a diagram for explaining an electric field simulation model for a voltage generator including an L-shaped joint fitting.
Figure 13:
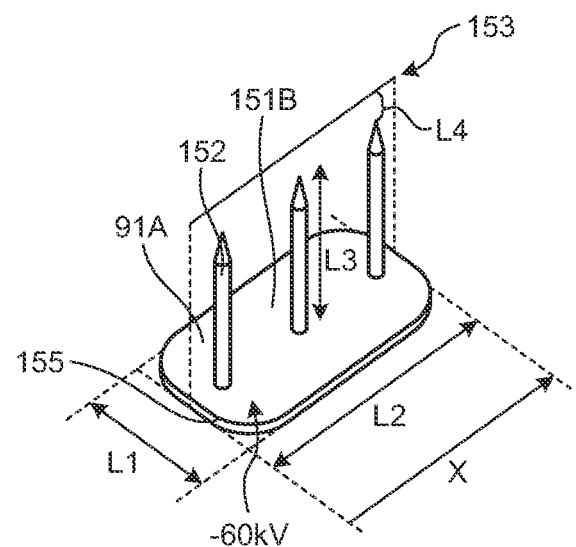
FIG. 13 is a diagram for explaining an electric field simulation model for a voltage generator not including an L-shaped joint fitting.

Next, a description will be made of a simulation based on an electric field simulation model performed to check the effect of electric field relaxation of the L-shaped joint fitting 71. FIG. 12 is a diagram for explaining an electric field simulation model for the voltage generator including the L-shaped joint fitting. FIG. 13 is a diagram for explaining an electric field simulation model for the voltage generator not including the L-shaped joint fitting. FIG. 12 illustrates an electric field simulation model 151A in a case where the voltage generator 100 of the first embodiment includes the L-shaped joint fitting 71, and FIG. 13 illustrates an electric field simulation model 151B in a case where a voltage generator of a comparative example does not include the L-shaped joint fitting 71. Note that the voltage generator of the comparative example includes the bottom surface portion 91A fixed to the insulating substrate.

In the electric field simulation models 151A and 151B, needles 152 are disposed as lead forming portions included in the components.

The electric field simulation models 151A and 151B used the following conditions (1) to (4).

(1) The dimensions of the bottom surface of the bottom surface portion 91A in the electric field simulation models 151A and 151B are set to a longitudinal dimension of $L1=20$ mm and a lateral dimension of $L2=40$ mm. Moreover, in the electric field simulation model 151A, the back surface portion 92A having a height dimension of $L5=51$ mm is provided. Note, however, that the plate thicknesses of the electric field simulation models 151A and 151B are not considered.

(2) The needle 152 has a height dimension of $L3=30$ mm, and a tip portion of the needle 152 has an acute angle.

(3) The needles 152 are arranged linearly at three positions separated by 5 mm, 20 mm, and 35 mm from a left end portion 155 of the bottom surface portion 91A.

(4) The electric field simulation models 151A and 151B are energized at −60 kV.

Here, a case where the electric field simulation models 151A and 151B simulate field intensity at a measurement position 153 will be described. The measurement position 153 is a position higher than the tip portion of the needle 152 by a height dimension of L4=+1 mm.

Figure 14:
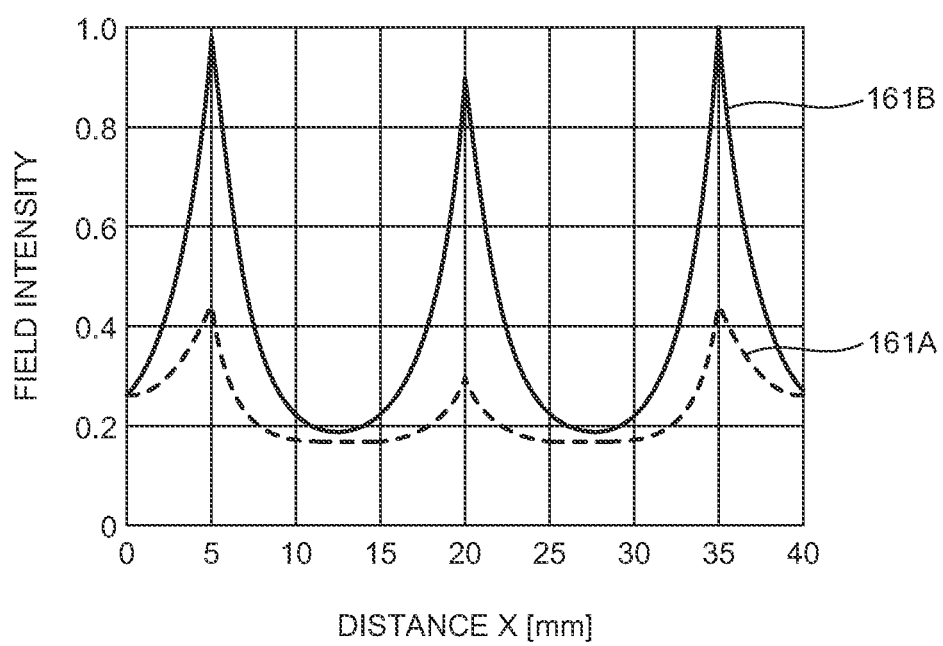
FIG. 14 is a graph for explaining simulation results of the electric field simulation models explained with reference to FIGS. 12 and 13.

FIG. 14 is a graph for explaining simulation results of the electric field simulation models explained with reference to FIGS. 12 and 13. FIG. 14 illustrates results of simulating the field intensity at a distance X from the left end portion 155 of the bottom surface portion 91A using the electric field simulation models 151A and 151B.

In FIG. 14, the horizontal axis represents the distance X from the left end portion 155 of the needle 152, and the vertical axis represents the field intensity. The simulation results illustrated in FIG. 14 indicate field intensities 161A and 161B in a case where the maximum value of the electric field in the electric field simulation model 151B without the L-shaped joint fitting 71 in FIG. 13 is normalized to one. The field intensity 161A is the simulation result by the electric field simulation model 151A, and the field intensity 161B is the simulation result by the electric field simulation model 151B.

From the simulation results, it can be seen that the field intensity at the position where the needle 152 is located is high. It can also be seen that the electric field simulation model 151A with the L-shaped joint fitting 71 of FIG. 12 has lower field intensity as a whole than the electric field simulation model 151B without the L-shaped joint fitting 71 of FIG. 13. This means that the electric potential is the same within the region contained in the L-shaped joint fitting 71, and it can be seen that even when a portion such as the needle 152 where electric field concentration is likely to occur is included, the electric field can be relaxed as long as the portion is disposed within the region contained in the L-shaped joint fitting 71.

As described above, in the first embodiment, the L-shaped joint fittings 71 are disposed at the input part 11 and the output part 12 being the substrate ends of the stages 31A to 31C from which discharge is likely to originate, and the components such as the capacitor 4 are connected to the L-shaped joint fittings 71. As a result, in the voltage generator 100, the positional relationship between the connection line 51Y such as the high-voltage output cable and the capacitor 4 or the like does not cause a problem, so that the electric field can be relaxed and that the occurrence of discharge can be prevented. That is, the voltage generator 100 can sufficiently secure the insulation tolerance, thereby not needing to increase the size of the booster circuit and being able to implement the booster circuit that is miniaturized.

Modifications of First Embodiment

The first embodiment is not limited to the mode described above but includes various modifications. Examples of the modifications of the first embodiment include the following (a) to (c).

(a) In the present modification, the method of connecting the components of the L-shaped joint fitting 71 is changed from that of the example of FIG. 10, whereby the assembly work is made easier than in the example of FIG. 10 without changing the outer peripheral shape of the L-shaped joint fitting 71.

Figure 15:
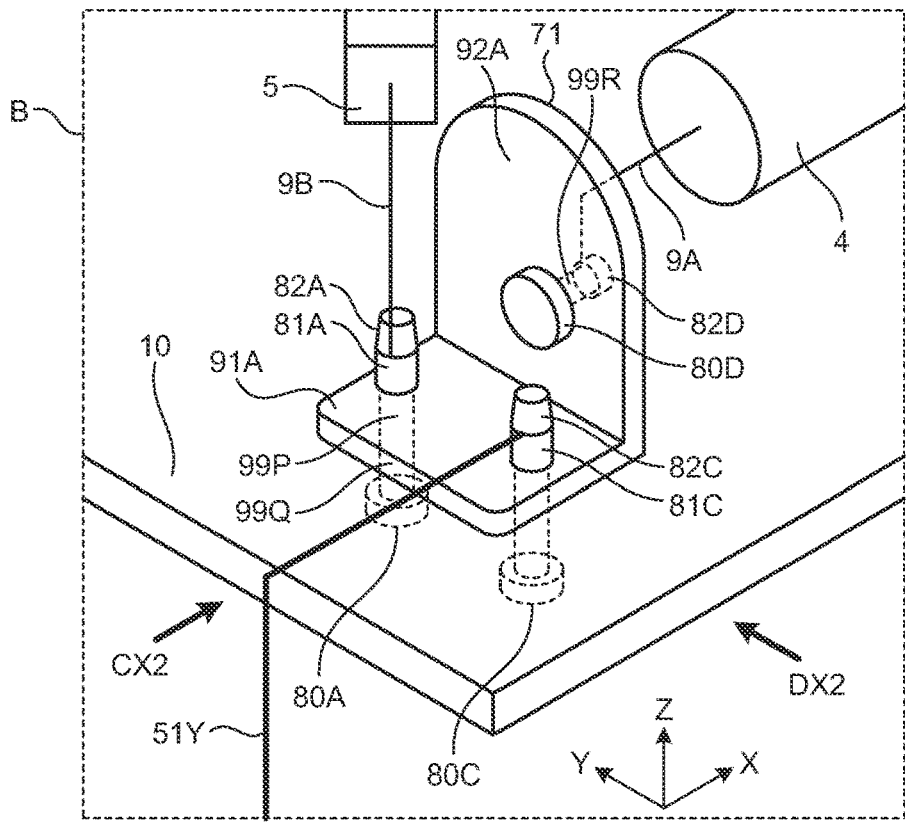
FIG. 15 is a diagram for explaining another configuration of the L-shaped joint fitting attached to the stage included in the voltage generator according to the first embodiment.
Figure 16:
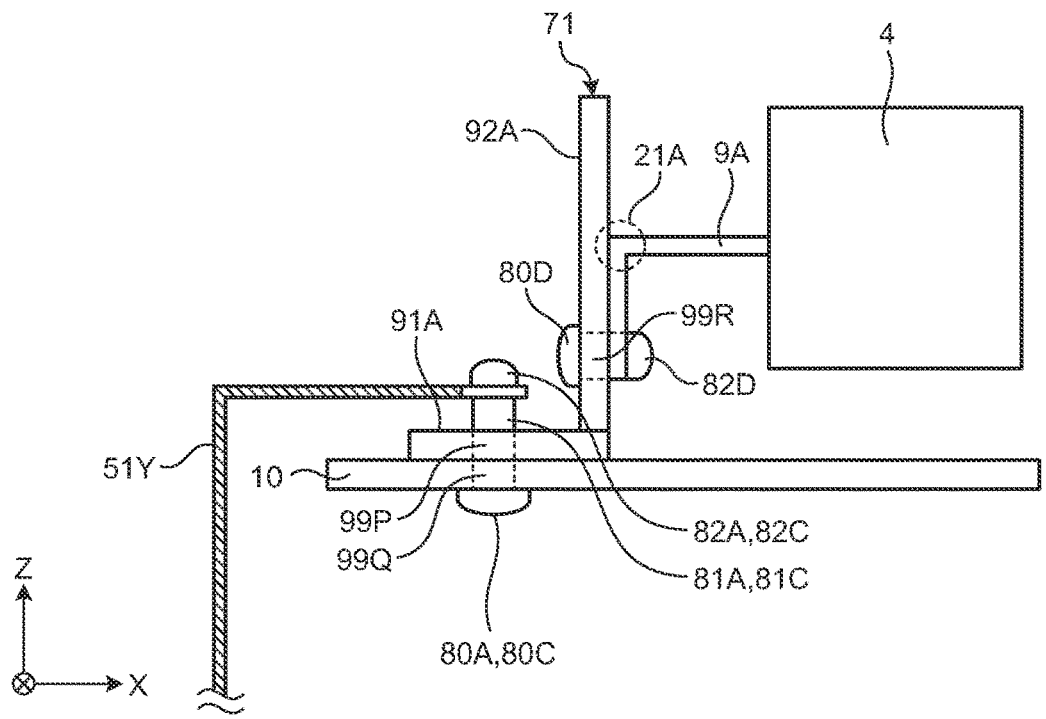
FIG. 16 is a diagram for explaining a method of connecting the back surface portion and the capacitor illustrated in FIG. 15.

FIG. 15 is a diagram for explaining another configuration of the L-shaped joint fitting attached to the stage included in the voltage generator according to the first embodiment. Note that FIG. 15 corresponds to the enlarged portion B for the L-shaped joint fitting 71 illustrated in FIG. 5. FIG. 16 is a diagram for explaining a method of connecting the back surface portion and the capacitor illustrated in FIG. 15. Components in FIGS. 15 and 16 that achieve the same functions as those of the voltage generator 100 illustrated in FIGS. 8 and 10 are assigned the same reference numerals as those assigned to the corresponding components in FIGS. 8 and 10, and thus redundant description will be omitted.

FIG. 15 illustrates a perspective view of the L-shaped joint fitting 71 attached to the stage 31A. FIG. 16 illustrates a structure of the L-shaped joint fitting 71 when the L-shaped joint fitting 71 is viewed from a DX2 direction in FIG. 15. That is, FIG. 16 illustrates a diagram in which the L-shaped joint fitting 71 is viewed from a side.

In the modification of the first embodiment, the L-shaped joint fitting 71 includes two of the bolt through holes 99P in the bottom surface portion 91A and one bolt through hole 99R in the back surface portion 92A. Note that the bolt hole diameters and positions of the bolt through holes 99P and 99R in the bottom surface portion 91A and the back surface portion 92A are not limited to the bolt hole diameters and positions illustrated in FIG. 16.

Bolts are passed through the bolt through holes 99P formed in the bottom surface portion 91A and the bolt through holes 99Q formed in the insulating substrate 10, and nuts are screwed onto the bolts, whereby the L-shaped joint fitting 71 is fixed to the insulating substrate 10. In the example of FIG. 16, the bolts 80A and 80C are passed through the bolt through holes 99P formed in the bottom surface portion 91A and the bolt through holes 99Q formed in the insulating substrate 10. The bolt 80A is fixed by the fixing nut 81A, and the bolt 80C is fixed by the fixing nut 81C.

Also in the modification of the first embodiment illustrated in FIG. 16, processing similar to the processing described with reference to FIG. 8 allows the bottom surface portion 91A of the L-shaped joint fitting 71, the diode 5, and the connection line 51Y to be fixed to the insulating substrate 10.

A bolt 80D is passed through the bolt through hole 99R in the back surface portion 92A, and a covering nut 82D is provided at a tip portion of a screw portion of the bolt 80D. The lead 9A of the capacitor 4 is lead-formed, the tip portion of the lead 9A is sandwiched between the L-shaped joint fitting 71 and the covering nut 82D, and the L-shaped joint fitting 71 and the covering nut 82D are fastened. As a result, the capacitor 4 is electrically connected to the L-shaped joint fitting 71.

In this case, the lead forming portion 21A of the lead 9A of the capacitor 4 and the tip portion of the lead 9A extending from the lead forming portion 21A toward the covering nut 82D are disposed along (that is, in contact with) the back surface portion 92A of the L-shaped joint fitting 71. That is, the lead 9A of the capacitor 4 from the lead forming portion 21 to the covering nut 82D, which is a component connecting portion, is in contact with the back surface portion 92A. Thus, the lead forming portion 21A of the lead 9A of the capacitor 4 has the same potential as the L-shaped joint fitting 71, so that the electric field depends on the outer peripheral shape of the L-shaped joint fitting 71 and that the electric field does not concentrate on the lead forming portion 21A. As a result, the voltage generator 100 can prevent discharge.

With such a configuration, in the modification according to the first embodiment, the capacitor 4 can be connected to the L-shaped joint fitting 71 without causing the lead 9A of the capacitor 4 to pass through the lead through hole 98 in the L-shaped joint fitting 71 described with reference to FIG. 8 and without losing the effect of electric field relaxation.

(b) The present modification changes the outer peripheral shape of the L-shaped joint fitting from that of the example of FIG. 10 to an inverted T-shaped joint fitting (hereinafter referred to as a T-shaped joint fitting 74) and changes the method of connecting the components, thereby achieving electric field relaxation more reliably than in the example of FIG. 10.

Figure 28:
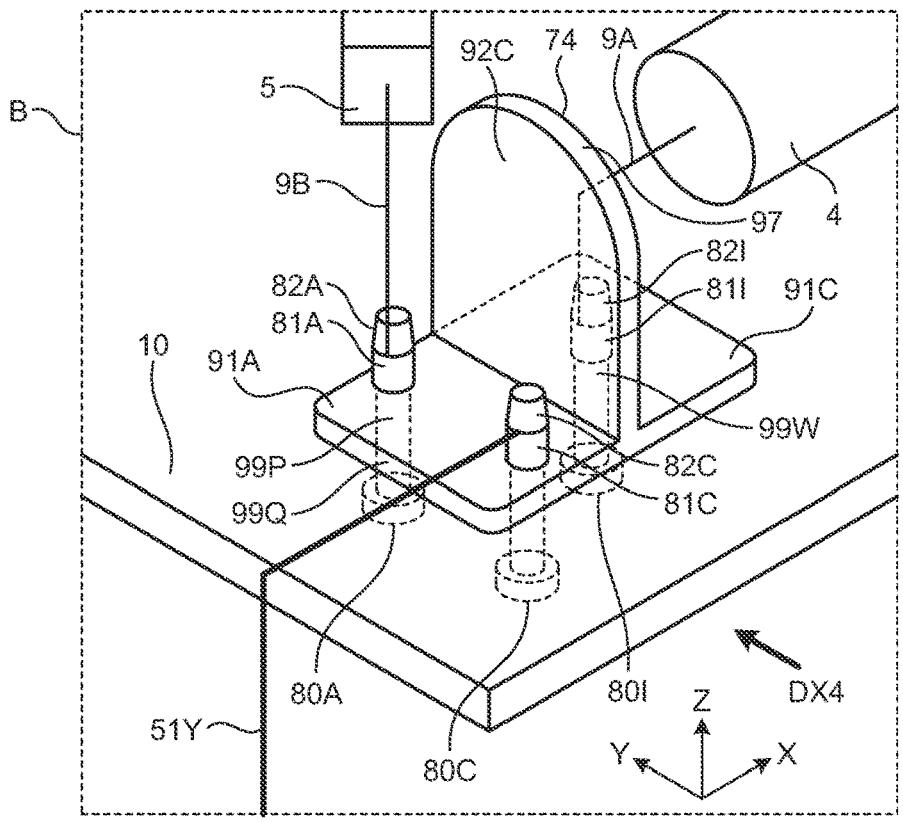
FIG. 28 is a diagram for explaining a configuration of a T-shaped joint fitting attached to the stage included in the voltage generator according to the first embodiment.
Figure 29:
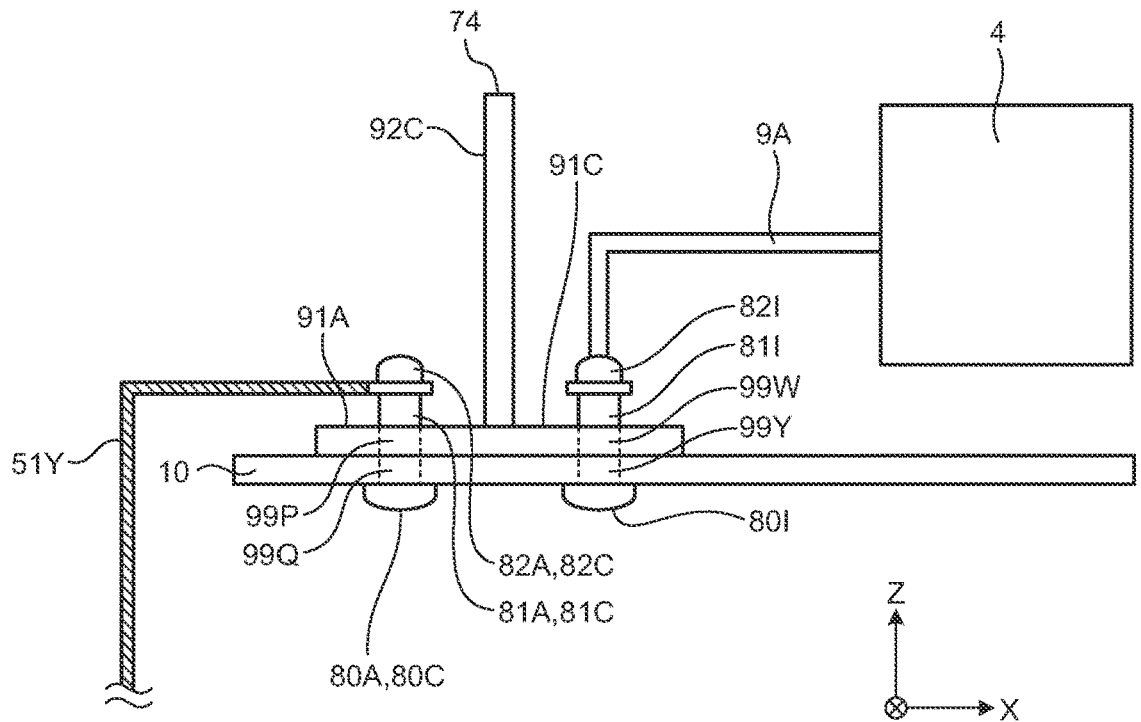
FIG. 29 is a diagram for explaining a method of connecting a back surface portion and the capacitor illustrated in FIG. 28.

FIG. 28 is a diagram for explaining a configuration of the T-shaped joint fitting attached to the stage included in the voltage generator according to the first embodiment. Note that FIG. 28 corresponds to the enlarged portion B for the L-shaped joint fitting 71 illustrated in FIG. 5. FIG. 29 is a diagram for explaining a method of connecting a back surface portion and the capacitor illustrated in FIG. 28. Note that components in FIGS. 28 and 29 that achieve the same functions as those of the voltage generator 100 illustrated in FIGS. 8 and 10 are assigned the same reference numerals as those assigned to the corresponding components in FIGS. 8 and 10, and thus redundant description will be omitted.

First, a structure of the T-shaped joint fitting 74 will be described. FIG. 28 illustrates a perspective view of the T-shaped joint fitting 74 attached to the stage 31A. FIG. 29 illustrates a structure of the T-shaped joint fitting 74 when the T-shaped joint fitting 74 is viewed from a DX4 direction in FIG. 28. That is, FIG. 29 illustrates a diagram in which the T-shaped joint fitting 74 is viewed from a side. The T-shaped joint fitting 74 has an inverted T-shape when viewed from the DX4 direction in FIG. 28.

The T-shaped joint fitting 74 includes a bottom surface portion 91C on a side opposite to that of the bottom surface portion 91A when viewed from a back surface portion 92C of the T-shaped joint fitting 74. That is, the bottom surface portions 91A and 91C are disposed at positions facing each other with the back surface portion 92C interposed therebetween. The bottom surface portion 91C has a shape similar to that of the bottom surface portion 91A. The T-shaped joint fitting 74 is formed by combining a plurality of thin plate members. The T-shaped joint fitting 74 thus has a structure including the L-shaped joint fitting 71, and has a shape in which the bottom surface portion 91C is added to the L-shaped joint fitting 71.

The bottom surface portion 91C is provided with a bolt through hole 99W through which a bolt can be passed. Moreover, the insulating substrate 10 is provided with a bolt through hole 99Y through which a bolt can be passed. A bolt is passed through the bolt through hole 99W and the bolt through hole 99Y, and a nut is screwed onto the bolt, whereby the T-shaped joint fitting 74 is fixed to the insulating substrate 10.

Note that while the bottom surface portion 91A and the bottom surface portion 91C of the T-shaped joint fitting 74 are attached to the insulating substrate 10, the back surface portion 92C is not necessarily perpendicular to the insulating substrate 10.

As with the L-shaped joint fitting 71, in order to relax the electric field on the outer periphery of the T-shaped joint fitting 74, the edge 97 of the bottom surface portions 91A and 91C and the back surface portion 92C is subjected to edge processing so as to be rounded. Moreover, in the T-shaped joint fitting 74, the rim of the outer periphery of the T-shaped joint fitting 74 is chamfered.

Also in the modification illustrated in FIG. 29, processing similar to the processing described with reference to FIG. 9 allows the bottom surface portion 91A of the T-shaped joint fitting 74, the diode 5, and the connection line 51Y to be fixed to the insulating substrate 10.

A bolt 80I is passed through the bolt through hole 99W of the bottom surface portion 91C, and the bolt 80I is fixed by a fixing nut 81I. A covering nut 82I is further provided at a tip portion of a screw portion of the 2 bolt 80I. The lead 9A of the capacitor 4 is lead-formed, the tip portion of the lead 9A is sandwiched between the T-shaped joint fitting 74 and the covering nut 82I, and the T-shaped joint fitting 74 and the covering nut 82I are fastened. As a result, the capacitor 4 is electrically connected to the T-shaped joint fitting 74.

Therefore, the lead forming portion 21 of the lead 9A of the capacitor 4 can be contained in the T-shaped joint fitting 74, whereby the electric field can be relaxed.

In the example of FIG. 10, the electric field may be concentrated due to a protrusion such as a burr generated after processing of the lead through hole 98. On the other hand, in the T-shaped joint fitting 74, the outer periphery is T-shaped and the method of connecting the components is changed, so that the lead through hole 98 is unnecessary and that the electric field generated in the lead through hole 98 can be eliminated. Moreover, since the connecting portions for all the components and the lead forming portion 21 can fit within the area of a main surface of the back surface portion 92C and the area of the bottom surface portions 91A and 91C, the effect of electric field relaxation can be more reliably achieved.

Furthermore, in the L-shaped joint fitting 71, only the bottom surface portion 91A is fixed to the insulating substrate 10, whereas in the T-shaped joint fitting 74, the bottom surface portion 91A and the bottom surface portion 91C can be fixed to the insulating substrate 10. As a result, the area of contact with the insulating substrate 10 increases so that the T-shaped joint fitting 74 can be fixed to be robust against vibration.

(c) The present modification changes the outer peripheral shape of the L-shaped joint fitting from that of the example of FIG. 10 to a U-shaped joint fitting (hereinafter referred to as a U-shaped joint fitting 72) and changes the method of connecting the components, thereby having a higher effect of electric field relaxation than in the example of FIG. 10.

Figure 30:
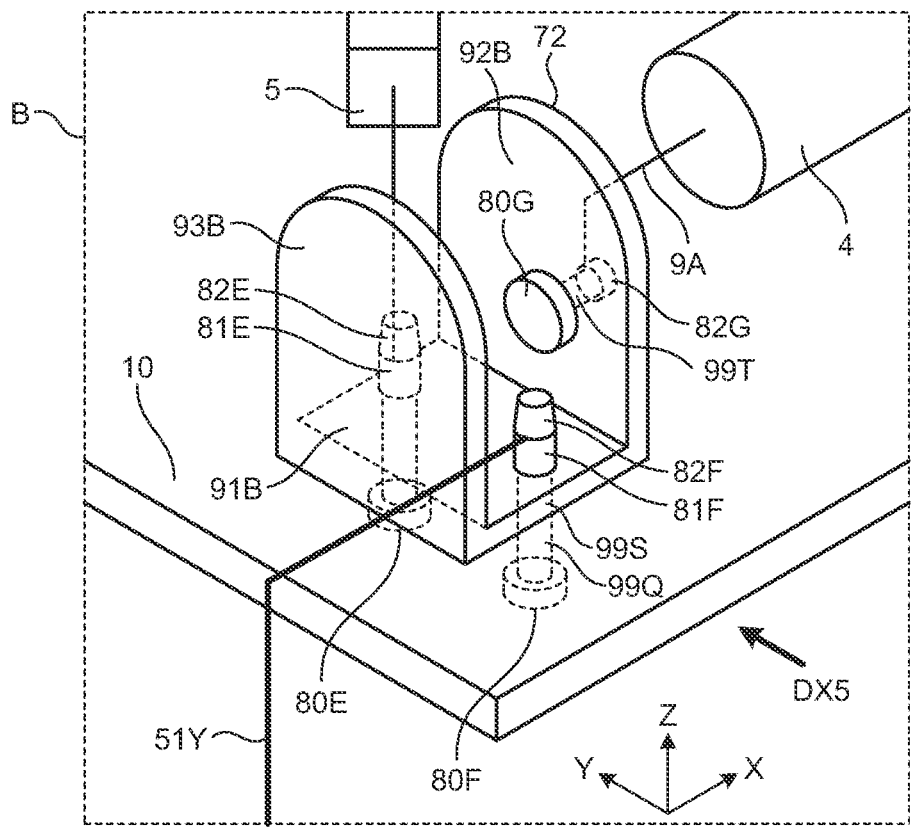
FIG. 30 is a diagram for explaining a U-shaped joint fitting attached to the stage included in the voltage generator according to the first embodiment.
Figure 31:
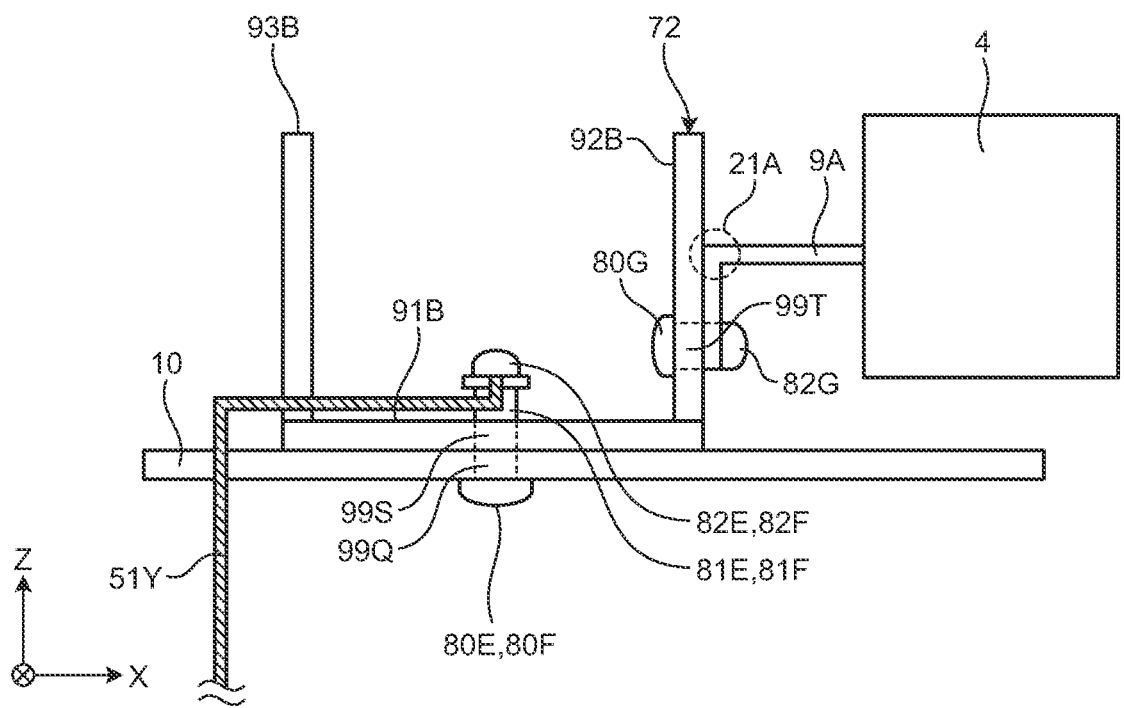
FIG. 31 is a diagram for explaining a method of connecting a back surface portion and the capacitor illustrated in FIG. 30.

FIG. 30 is a diagram for explaining the U-shaped joint fitting attached to the stage included in the voltage generator according to the first embodiment. Note that FIG. 30 corresponds to the enlarged portion B for the L-shaped joint fitting 71 illustrated in FIG. 5. FIG. 31 is a diagram for explaining a method of connecting a back surface portion and the capacitor illustrated in FIG. 30. Note that components in FIGS. 30 and 31 that achieve the same functions as those of the voltage generator 100 illustrated in FIGS. 8 and 10 are assigned the same reference numerals as those assigned to the corresponding components in FIGS. 8 and 10, and thus redundant description will be omitted.

First, a structure of the U-shaped joint fitting 72 will be described. FIG. 30 illustrates a perspective view of the U-shaped joint fitting 72 attached to the stage 31A. FIG. 31 illustrates a structure of the U-shaped joint fitting 72 when the U-shaped joint fitting 72 is viewed from a DX5 direction in FIG. 30. That is, FIG. 31 illustrates a diagram in which the U-shaped joint fitting 72 is viewed from a side. The U-shaped joint fitting 72 has a U-shape when viewed from the DX5 direction in FIG. 30. The U-shaped joint fitting 72 illustrated in FIGS. 30 and 31 has a structure similar to that of the U-shaped joint fitting 72 described with reference to FIG. 20.

The U-shaped joint fitting 72 includes a plate-shaped bottom surface portion 91B that is a second bottom surface portion, a plate-shaped back surface portion 92B that is a second back surface portion bent upward, and a plate-shaped front surface portion 93B bent upward. That is, the U-shaped joint fitting 72 has a structure including the L-shaped joint fitting 71, and has a shape in which the front surface portion 93B is added to the L-shaped joint fitting 71.

In the U-shaped joint fitting 72, a portion where electric field concentration is likely to occur as viewed from the front surface portion 93B can be projected onto the back surface portion 92B, and a portion where electric field concentration is likely to occur as viewed from the back surface portion 92B can be projected onto the front surface portion 93B. That is, since portions where electric field concentration is likely to occur can be projected mutually onto both the front surface portion 93B and the back surface portion 92B, the effect of electric field relaxation can be made higher than that of the L-10 shaped joint fitting 71.

As described above, in the first embodiment, when the main surface of the back surface portion 92A is viewed from a direction perpendicular to the main surface of the back surface portion 92A, the L-shaped joint fitting 71 is disposed at the substrate end on the insulating substrate 10 such that the lead forming portions 21A and 21B and the component connecting portion of the L-shaped joint fitting 71 fit within the area of the main surface of the back surface portion 92A. As a result, the CW circuit 1 can relax the electric field at the substrate ends of the stages 31A to 31C. Moreover, since the bolts and nuts are used to fix the L-shaped joint fitting 71 onto the insulating substrate 10, the L-shaped joint fitting 71 is easily fixed. Therefore, the CW circuit 1 can be easily manufactured and can prevent the occurrence of discharge.

Second Embodiment

Next, a second embodiment will be described with reference to FIGS. 17 to 22. In the first embodiment described above, the electric field at the substrate end can be relaxed, but the electric field may concentrate on the inside of the stages 31A to 31C such as the component connecting portion and the lead forming portion in the conductive pattern portion 70 illustrated in FIG. 5, for example. Therefore, in the second embodiment, in order to be able to relax the electric field even in the internal region on the stages 31A to 31C, the U-shaped joint fitting 72 formed by bending a thin plate member into a substantially U-shape is disposed to prevent the occurrence of discharge in the conductive pattern portion 70. The U-shaped joint fitting 72 is a conductive U-shaped joint fitting fixed to the insulating substrate 10.

Figure 17:
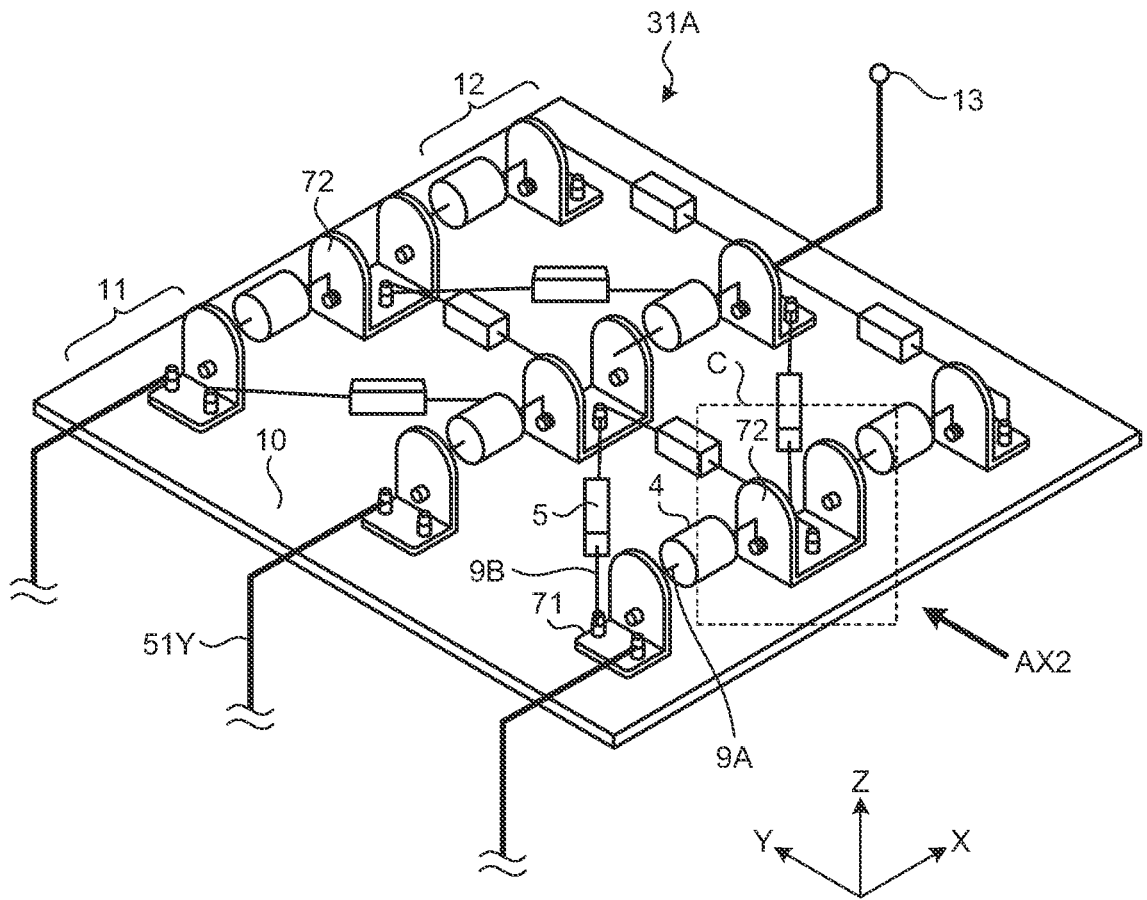
FIG. 17 is a perspective view illustrating a structure of a stage included in a voltage generator according to a second embodiment.
Figure 18:
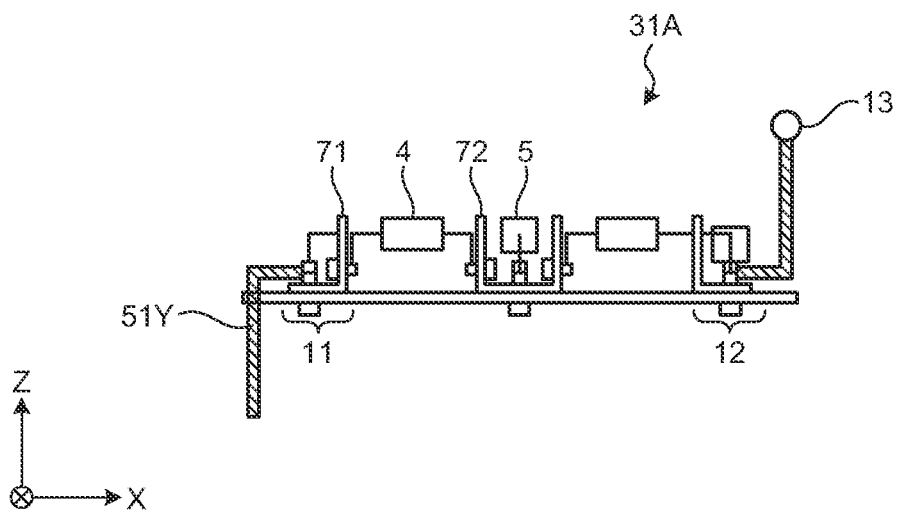
FIG. 18 is a side view illustrating a structure of the stage included in the voltage generator according to the second embodiment.

FIG. 17 is a perspective view illustrating a structure of the stage included in the voltage generator according to the second embodiment. FIG. 18 is a side view illustrating the structure of the stage included in the voltage generator according to the second embodiment. FIGS. 17 and 18 illustrate the structure for one stage. Note that since the stages 31A to 31C have similar structures, the structure of the stage 31A will be described here. FIG. 18 illustrates the structure of the stage 31A when the stage 31A is viewed from an AX2 direction in FIG. 17. Components in FIGS. 17 and 18 that achieve the same functions as those of the stage 31A of the first embodiment illustrated in FIGS. 5 and 6 are denoted by the same reference numerals as those assigned to the corresponding components in FIGS. 5 and 6, and thus redundant description will be omitted.

The stage 31A of the second embodiment includes the insulating substrate 10, the capacitors 4, the diodes 5, the L-shaped joint fittings 71, and the U-shaped joint fittings 72. The example of FIG. 17 illustrates a case where a plurality of the capacitors 4, a plurality of the diodes 5, a plurality of the L-shaped joint fittings 71, and a plurality of the U-shaped joint fittings 72 are disposed on the insulating substrate 10.

In the voltage generator 100, the insulating substrate 10 on which components such as the capacitors 4, the diodes 5, the L-shaped joint fittings 71, and the U-shaped joint fittings 72 are mounted is fixed to the column 6, thereby forming the CW circuit 1. Note that although FIG. 17 illustrates the positions where the capacitors 4, the diodes 5, the L-shaped joint fittings 71, and the U-shaped joint fittings 72 are disposed, the positions where the capacitors 4, the diodes 5, the L-shaped joint fittings 71, and the U-shaped joint fittings 72 are disposed are not limited to those illustrated in FIG. 17.

The L-shaped joint fitting 71 is disposed at a component connecting portion for components disposed in each of the input part 11 and the output part 12 of the stage 31A. The lead 9A of the capacitor 4, the lead 9B of the diode 5, and the connection line 51Y are electrically connected to the insulating substrate 10 via the L-shaped joint fitting 71.

On the other hand, the U-shaped joint fitting 72 is disposed at a component connecting portion for components in the internal region of the stage 31A. The lead 9A of the capacitor 4, the lead 9B of the diode 5, and the insulating substrate 10 are electrically connected via the U-shaped joint fitting 72. Therefore, the component connecting portion in the internal region of the stage 31A is located on the U-shaped joint fitting 72. The component connecting portion in the internal region of the stage 31A is a second component connecting portion. An example of the internal region of the stage 31A is the region where the conductive pattern portion 70 illustrated in FIG. 5 is disposed.

Among the leads 9A, the lead 9A connected to the second component connecting portion is a third lead, and among the leads 9B, the lead 9B connected to the second component connecting portion is a fourth lead.

Among the capacitors 4, the capacitor 4 connected at the second component connecting portion is a second capacitor. Among the diodes 5, the diode 5 connected at the second component connecting portion is a second diode.

Figure 19:
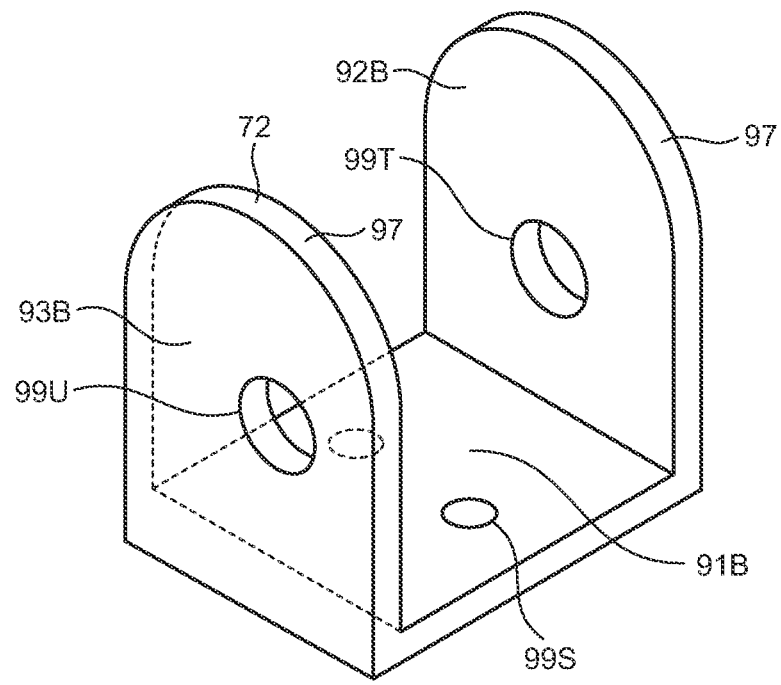
FIG. 19 is a perspective view illustrating a structure of a U-shaped joint fitting included in the voltage generator according to the second embodiment.

Here, the U-shaped joint fitting 72 will be described. FIG. 19 is a perspective view illustrating a structure of the U-shaped joint fitting included in the voltage generator according to the second embodiment. The U-shaped joint fitting 72 is a metal fitting having a U-shaped cross section formed by bending both ends of a conductive thin plate member (such as aluminum or copper) upward. The U-shaped joint fitting 72 includes the plate-shaped bottom surface portion 91B that is the second bottom surface portion, the plate-shaped back surface portion 92B that is the second back surface portion bent upward, and the plate-shaped front surface portion 93B bent upward.

The U-shaped joint fitting 72 includes bolt through holes 99S through which bolts can be passed in the bottom surface portion 91B, a bolt through hole 99T in the back surface portion 92B, and a bolt through hole 99U in the front surface portion 93B.

Note that the U-shaped joint fitting 72 does not necessarily have to be formed by bending the thin plate member at a right angle. Also, the U-shaped joint fitting 72 may be formed of one thin plate member, or may be formed by combining a plurality of thin plate members.

The U-shaped joint fitting 72 may also be formed by combining two L-shaped metal fittings. Moreover, the bolt hole diameters and positions of the bolt through holes 99S, 99T, and 99U in the bottom surface portion 91B, the back surface portion 92B, and the front surface portion 93B are not limited to the bolt hole diameters and positions illustrated in FIG. 19.

As with the L-shaped joint fitting 71, the U-shaped joint fitting 72 is easily discharged when there is a protrusion on an outer periphery of the U-shaped joint fitting 72, so that in order to relax the electric field on the outer periphery, the edge 97 of the back surface portion 92B and the front surface portion 93B is subjected to edge processing so as to be rounded.

Moreover, in the U-shaped joint fitting 72, the rim of the outer periphery of the U-shaped joint fitting 72 is chamfered as with the L-shaped joint fitting 71. Note that chamfering is preferably R-chamfering in order to minimize the size of the protrusion.

The U-shaped joint fitting 72 can be manufactured only by bending, drilling, edge processing, and chamfering of the thin plate member with no need for special processing, and thus disposing the U-shaped joint fitting 72 does not significantly increase the manufacturing cost of the voltage generator 100.

Figure 20:
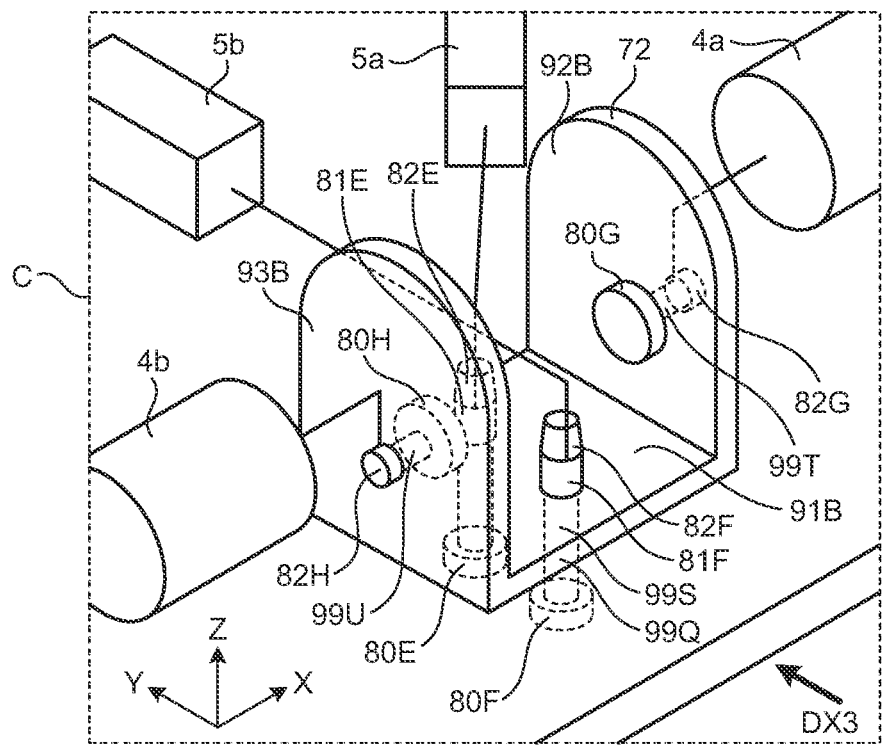
FIG. 20 is a diagram for explaining a configuration of the U-shaped joint fitting attached to the stage included in the voltage generator according to the second embodiment.
Figure 21:
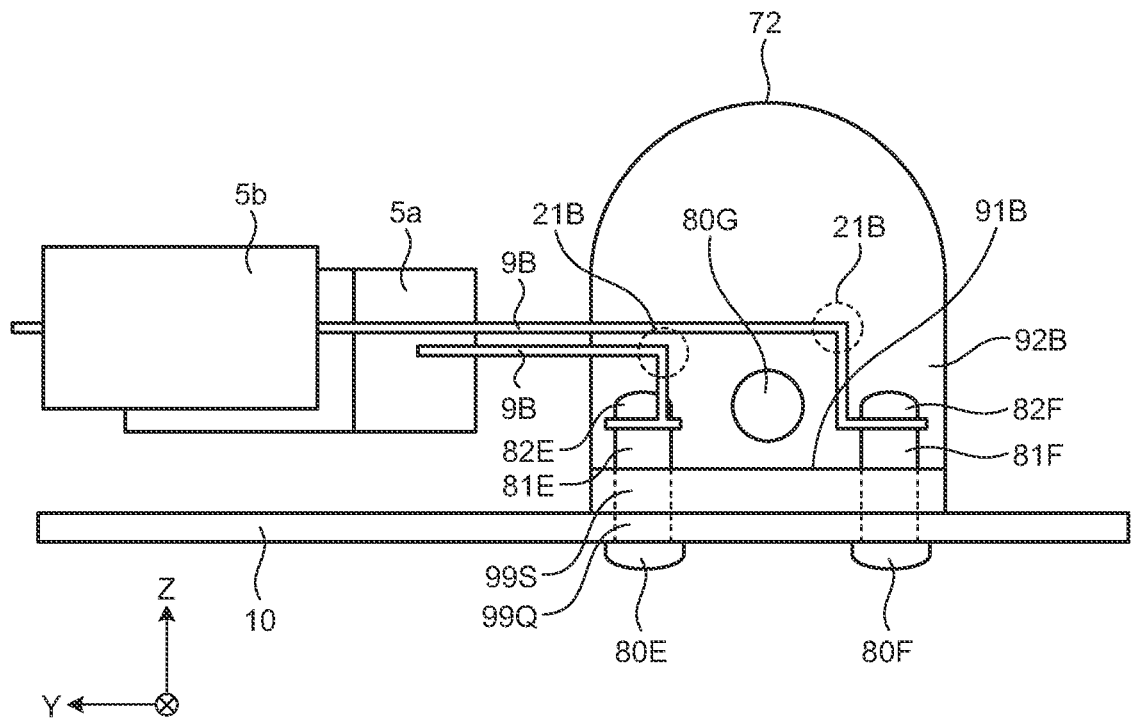
FIG. 21 is a diagram for explaining a method of connecting a bottom surface portion and diodes illustrated in FIG. 20.
Figure 22:
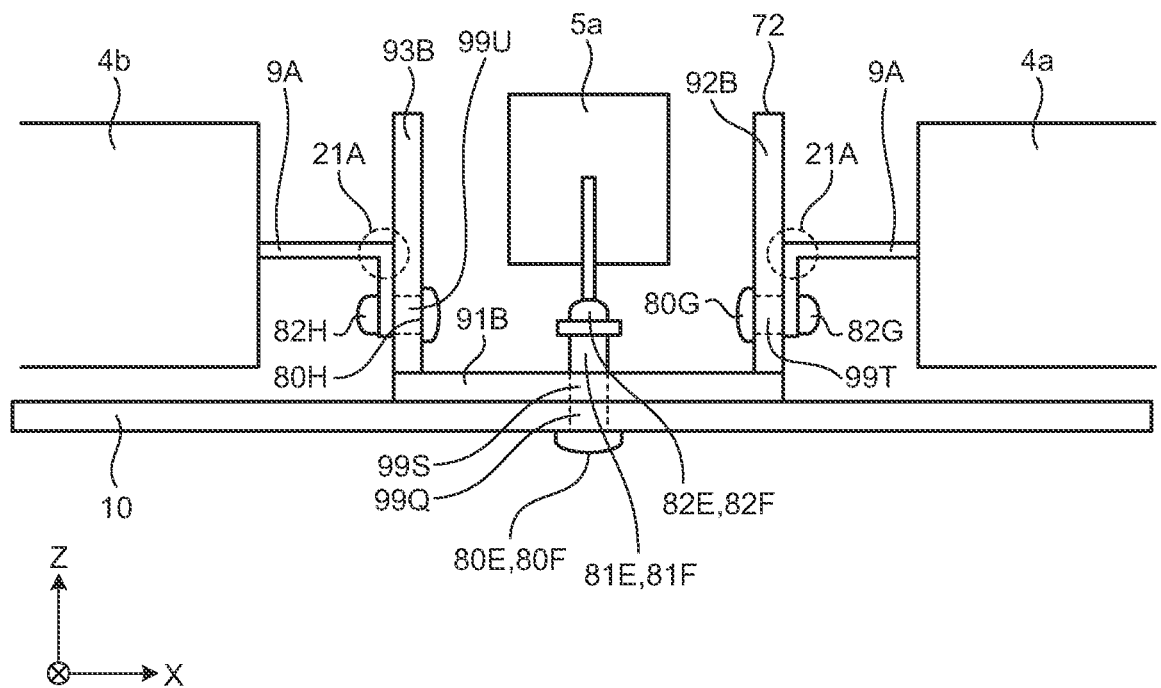
FIG. 22 is a diagram for explaining a method of connecting a back surface portion and capacitors illustrated in FIG. 20.

FIG. 20 is a diagram for explaining a configuration of the U-shaped joint fitting attached to the stage included in the voltage generator according to the second embodiment. Note that FIG. 20 is an enlarged portion C for the U-shaped joint fitting 72 illustrated in FIG. 17. FIG. 21 is a diagram for explaining a method of connecting the bottom surface portion and diodes illustrated in FIG. 20. FIG. 22 is a diagram for explaining a method of connecting the back surface portion and capacitors illustrated in FIG. 20.

FIG. 20 illustrates a perspective view of the U-shaped joint fitting 72 attached to the stage 31A. FIG. 21 illustrates a structure of the U-shaped joint fitting 72 when the U-shaped joint fitting 72 is viewed from the front surface portion 93B toward the back surface portion 92B of FIG. 20. That is, FIG. 21 illustrates a cross-sectional view of the U-shaped joint fitting 72 when the bottom surface portion 91B is cut along a plane parallel to a main surface of the front surface portion 93B and a main surface of the back surface portion 92B and perpendicular to a main surface of the bottom surface portion 91B. FIG. 22 illustrates a structure of the U-shaped joint fitting 72 when the U-shaped joint fitting 72 is viewed from a DX3 direction in FIG. 20. That is, FIG. 22 illustrates a diagram in which the U-shaped joint fitting 72 is viewed from a side.

Bolts are passed through the bolt through holes 99S formed in the bottom surface portion 91B and the bolt through holes 99Q formed in the insulating substrate 10, and nuts are screwed onto the bolts, whereby the U-shaped joint fitting 72 is fixed to the insulating substrate 10. Note that the bolts and the nuts are made of conductive material.

In FIG. 21, a method of connecting the bottom surface portion 91B of the U-shaped joint fitting 72 and diodes 5a and 5b to the insulating substrate 10 will be described. In the insulating substrate 10, bolts 80E and 80F are passed through the bolt through holes 99S formed in the bottom surface portion 91B and the bolt through holes 99Q formed in the insulating substrate 10. The bolt 80E is fixed by a fixing nut 81E, and the bolt 80F is fixed by a fixing nut 81F. Covering nuts 82E and 82F are further provided at tip portions of screw portions of the bolts 80E and 80F, respectively.

The lead 9B of the diode 5a is lead-formed in the direction of the bottom surface portion 91B, a tip portion of the lead 9B is sandwiched between the fixing nut 81E and the covering nut 82E, and the fixing nut 81E and the covering nut 82E are fastened. As a result, the diode 5a is electrically connected to the U-shaped joint fitting 72.

The lead 9B of the diode 5b is lead-formed in the direction of the bottom surface portion 91B, a tip portion of the lead 9B is sandwiched between the fixing nut 81F and the covering nut 82F, and the fixing nut 81F and the covering nut 82F are fastened. As a result, the diode 5b is electrically connected to the U-shaped joint fitting 72. In this case, the lead 9B of the diode 5a and the lead 9B of the diode 5b are disposed so as not to be in contact with each other. This is because, by contact, a point of the contact has an acute angle, and discharge may originate therefrom. The diodes 5a and 5b are disposed at different heights, for example.

As a result, component connecting portions between the diodes 5a and 5b and the U-shaped joint fitting 72 can be contained in the U-shaped joint fitting 72. Moreover, the lead forming portion 21B of the lead 9B can be contained in the U-shaped joint fitting 72. That is, in the voltage generator 100, a portion where electric field concentration is likely to occur is sandwiched between the front surface portion 93B and the back surface portion 92B. In other words, in the voltage generator 100, when the component connecting portion and the lead forming portion 21B are viewed such that the main surface of the front surface portion 93B faces the front, the component connecting portion and the lead forming portion 21B fit within the main surface of the front surface portion 93B and the main surface of the back surface portion 92B.

Since the component connecting portion and the lead forming portion 21B have the same potential within the region contained in the U-shaped joint fitting 72, the electric field depends on the outer peripheral shape of the U-shaped joint fitting 72. That is, in the voltage generator 100, the electric field concentration does not occur in the protrusions of the component connecting portion and the lead forming portion 21B, and thus discharge can be prevented.

Note that, as with the L-shaped joint fitting 71, it is important for the U-shaped joint fitting 72 how the lead forming portion 21B can be projected by the back surface portion 92B and the front surface portion 93B of the U-shaped joint fitting 72. Therefore, the height dimensions of the back surface portion 92B and the front surface portion 93B are desirably higher than the height positions of the component connecting portion and the lead forming portion 21B. For a similar reason, in the horizontal direction of the lead forming portion 21B, it is desirable that the component connecting portion and the lead forming portion 21B are closer to the back surface portion 92B or the front surface portion 93B, or that the space between the back surface portion 92B and the front surface portion 93B is narrowed.

FIG. 22 will be used to describe a method of fixing the back surface portion 92B and a capacitor 4a to the insulating substrate 10 and a method of connecting the front surface portion 93B and a capacitor 4b to the insulating substrate 10. In the insulating substrate 10, a bolt 80G is passed through the bolt through hole 99T in the back surface portion 92B, and a tip portion of a screw portion of the bolt 80G is fastened with a covering nut 82G. A bolt 80H is passed through the bolt through hole 99U in the front surface portion 93B, and a tip portion of a screw portion of the bolt 80H is fastened with a covering nut 82H.

The lead 9A of the capacitor 4a is lead-formed in the direction of the covering nut 82G, a tip portion of the lead 9A is sandwiched between the U-shaped joint fitting 72 and the covering nut 82G, and the U-shaped joint fitting 72 and the covering nut 82G are fastened. As a result, the capacitor 4a is electrically connected to the U-shaped joint fitting 72.

Likewise, the lead 9A of the capacitor 4b is lead-formed in the direction of the covering nut 82H, a tip portion of the lead 9A is sandwiched between the U-shaped joint fitting 72 and the covering nut 82H, and the U-shaped joint fitting 72 and the covering nut 82H are fastened. As a result, the capacitor 4b is electrically connected to the U-shaped joint fitting 72. The lead forming portion 21A connected to the U-shaped joint fitting 72 is a third lead forming portion, and the lead forming portion 21B connected to the U-shaped joint fitting 72 is a fourth lead forming portion.

Thus, in the voltage generator 100 of the second embodiment, as illustrated in FIGS. 21 and 22, the component connecting portion for the capacitors 4a and 4b and the diodes 5a and 5b and the lead forming portion 21 of each of the leads 9A and 9B, in which electric field concentration is likely to occur, are contained in the U-shaped joint fitting 72. Specifically, in the voltage generator 100, when the main surface of the back surface portion 92B is viewed from a direction perpendicular to the main surface of the back surface portion 92B, the U-shaped joint fitting 72 is disposed such that the lead forming portions 21A and 21B and the component connecting portion of the U-shaped joint fitting 72 fit within the area of the main surface of the back surface portion 92B. Likewise, when the main surface of the front surface portion 93B is viewed from a direction perpendicular to the main surface of the front surface portion 93B, the U-shaped joint fitting 72 is disposed such that the lead forming portions 21A and 21B and the component connecting portion of the U-shaped joint fitting 72 fit within the area of the main surface of the front surface portion 93B. Moreover, in the voltage generator 100, when the main surface of the bottom surface portion 91B is viewed from a direction perpendicular to the main surface of the bottom surface portion 91B, the U-shaped joint fitting 72 is disposed such that the lead forming portions 21A and 21B and the component connecting portion of the U-shaped joint fitting 72 fit within the area of the main surface of the bottom surface portion 91B.

That is, in the voltage generator 100, the front surface portion 93B, the back surface portion 92B, and the bottom surface portion 91B are disposed such that a portion where electric field concentration is likely to occur as viewed from the front surface portion 93B can be projected onto the back surface portion 92B, a portion where electric field concentration is likely to occur as viewed from the back surface portion 92B can be projected onto the front surface portion 93B, and a portion where electric field concentration is likely to occur as viewed from the bottom surface portion 91B can be projected onto the bottom surface portion 91B. In other words, in the voltage generator 100, when the component connecting portion and the lead forming portion 21 are viewed from the outside of the insulating substrate 10 such that the main surface of the back surface portion 92B faces the front, the component connecting portion and the lead forming portion 21 fit within the main surfaces of the front surface portion 93B and the back surface portion 92B. Moreover, in the voltage generator 100, when the component connecting portion and the lead forming portion 21 are viewed from the outside of the insulating substrate 10 such that the main surface of the bottom surface portion 91B faces the front, the component connecting portion and the lead forming portion 21 fit within the main surface of the bottom surface portion 91B.

The lead forming portions 21A of the leads 9A of the capacitors 4a and 4b and the tip portions of the leads 9A extending from the lead forming portions 21A toward the covering nuts 82G and 82H are disposed along (that is, in contact with) the back surface portion 92B and the front surface portion 93B of the U-shaped joint fitting 72, respectively. That is, the leads 9A of the capacitors 4a and 4b from the lead forming portions 21A to the covering nuts 82G and 82H, which are the component connecting portions, are in contact with the back surface portion 92B and the front surface portion 93B, respectively. Thus, the lead forming portions 21A of the leads 9A of the capacitors 4a and 4b have the same potential as the U-shaped joint fitting 72, so that the electric field depends on the outer peripheral shape of the U-shaped joint fitting 72 and that the electric field does not concentrate on the lead forming portions 21A. As a result, the voltage generator 100 can prevent discharge.

Figure 23:
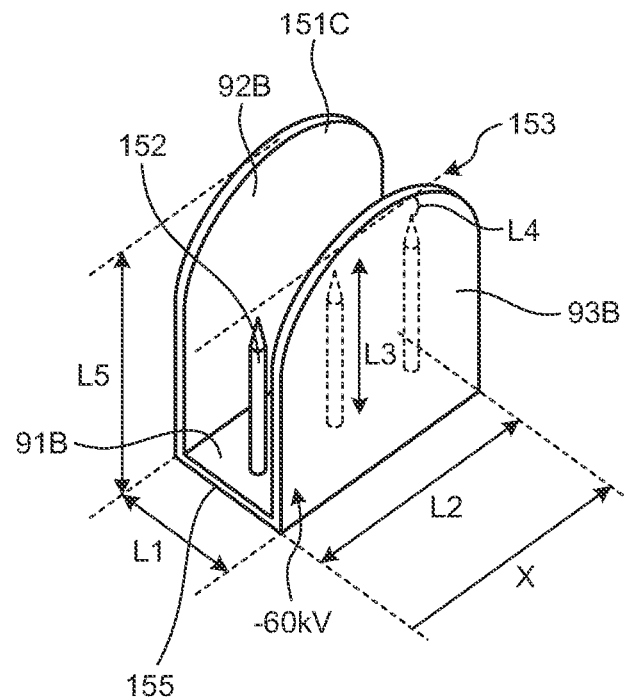
FIG. 23 is a diagram for explaining an electric field simulation model for a voltage generator including a U-shaped joint fitting.

Next, a description will be made of a simulation based on an electric field simulation model performed to check the effect of electric field relaxation of the U-shaped joint fitting 72. FIG. 23 is a diagram for explaining an electric field simulation model for the voltage generator including the U-shaped joint fitting. FIG. 23 illustrates an electric field simulation model 151C in a case where the voltage generator 100 of the second embodiment includes the U-shaped joint fitting 72. Note that, as described with reference to FIG. 13, the voltage generator of a comparative example includes the bottom surface portion 91B fixed to the insulating substrate.

In the electric field simulation model 151C, the needles 152 are disposed as lead forming portions included in the components.

The electric field simulation model 151C used the following conditions (5) to (8).
 (5) The dimensions of the bottom surface of the bottom surface portion 91B in the electric field simulation model 151C are set to a longitudinal dimension of L1=20 mm and a lateral dimension of L2=40 mm. Moreover, in the electric field simulation model 151C, the back surface portion 92B and the front surface portion 93B having a height dimension of L5=51 mm are provided. Note, however, that the plate thickness of the electric field simulation model 151C is not considered.
 (6) The needle 152 has a height dimension of L3=30 mm, and a tip portion of the needle 152 has an acute angle.
 (7) The needles 152 are arranged linearly at three positions separated by 5 mm, 20 mm, and 35 mm from the left end portion 155 of the bottom surface portion 91B.
 (8) The electric field simulation model 151C is energized at −60 kV.

Here, a case where the electric field simulation model 151C simulates field intensity at the measurement position 153 will be described. The measurement position 153 is the position higher than the tip portion of the needle 152 by a height dimension of L4=+1 mm.

Figure 24:
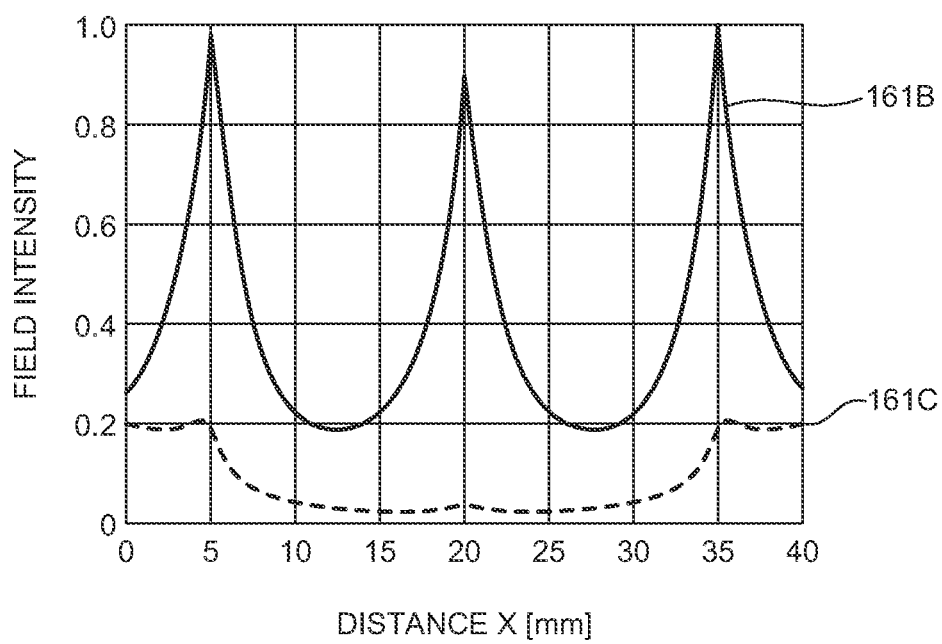
FIG. 24 is a graph for explaining a simulation result of the electric field simulation model explained with reference to FIG. 23.

FIG. 24 is a graph for explaining simulation results of the electric field simulation model explained with reference to FIG. 23. Note that, as in FIG. 14, FIG. 24 compares the simulation result in a case where the U-shaped joint fitting 72 is not included (the simulation result of the electric field simulation model 151B illustrated in FIG. 13) with the simulation result in a case where the U-shaped joint fitting 72 is included (the simulation result of the electric field simulation model 151C illustrated in FIG. 23). That is, FIG. 24 illustrates results of simulating the field intensity at the distance X from the left end portion 155 of the bottom surface portions 91A and 91B using the electric field simulation models 151B and 151C.

In FIG. 24, the horizontal axis represents the distance X from the left end portion 155 of the needle 152, and the vertical axis represents the field intensity. The simulation results illustrated in FIG. 24 indicate field intensities 161B and 161C in a case where the maximum value of the electric field in the electric field simulation model 151B without the U-shaped joint fitting 72 in FIG. 13 is normalized to one. The field intensity 161B is the simulation result by the electric field simulation model 151B, and the field intensity 161C is the simulation result by the electric field simulation model 151C.

From the simulation results, it can be seen that the field intensity at the position where the needle 152 is located is high. It can also be seen that the electric field simulation model 151C with the U-shaped joint fitting 72 of FIG. 24 has lower field intensity as a whole than the electric field simulation model 151B without the U-shaped joint fitting 72 of FIG. 13. This means that the electric potential is the same within the region contained in the U-shaped joint fitting 72, and it can be seen that even in the presence of a portion such as the needle 152 where electric field concentration is likely to occur, the electric field can be relaxed as long as the portion is disposed within the region contained in the U-shaped joint fitting 72.

As described above, in the second embodiment, when the main surface of the back surface portion 92B is viewed from a direction perpendicular to the main surface of the back surface portion 92B, the U-shaped joint fitting 72 is disposed in the internal region on the insulating substrate 10 such that the lead forming portions 21A and 21B and the component connecting portion of the U-shaped joint fitting 72 fit within the area of the main surface of the back surface portion 92B. Also, when the main surface of the front surface portion 93B is viewed from a direction perpendicular to the main surface of the front surface portion 93B, the U-shaped joint fitting 72 is disposed in the internal region on the insulating substrate 10 such that the lead forming portions 21A and 21B and the component connecting portion of the U-shaped joint fitting 72 fit within the area of the main surface of the front surface portion 93B. As a result, the CW circuit 1 can relax the electric field in the internal region of the stages 31A to 31C. Moreover, since the bolts and nuts are used to fix the U-shaped joint fitting 72 onto the insulating substrate 10, the U-shaped joint fitting 72 is easily fixed. Therefore, the CW circuit 1 can be easily manufactured and can prevent the occurrence of discharge.

The second embodiment can thus relax the electric field inside the stages 31A to 31C in addition to achieving the effect of the first embodiment.

Third Embodiment

Next, a third embodiment will be described with reference to FIGS. 25 to 27. In the second embodiment described above, the L-shaped joint fitting 71 and the U-shaped joint fitting 72 are disposed to relax the electric field at the component connecting portion for the components on the stages 31A to 31C and prevent the occurrence of discharge in air (gas). However, in the second embodiment, the L-shaped joint fitting 71 or the U-shaped joint fitting 72 serving as an electrode disposed on the insulating substrate 10 as an insulator in the air may cause the formation of an electrical triple junction (hereinafter referred to as a TJ portion) at a gas-insulator-electrode boundary point. This causes extreme local electric field concentration in the TJ portion, which may cause creeping discharge triggered by partial discharge in the TJ portion.

In order not to cause the local electric field concentration in the TJ portion, the components need to be disposed such that a line of electric force does not locally enter or exit the insulator. For this purpose, a contact angle of the TJ portion formed by the electrode and the insulator is important. That is, the contact angle of the TJ portion formed by the insulating substrate 10 and the L-shaped joint fitting 71 or the U-shaped joint fitting 72 is important.

Here, the TJ portion of the first and second embodiments will be described. Note that since the L-shaped joint fitting 71 and the U-shaped joint fitting 72 have similar TJ portions, the TJ portion of the L-shaped joint fitting 71 will be described here.

Figure 25:
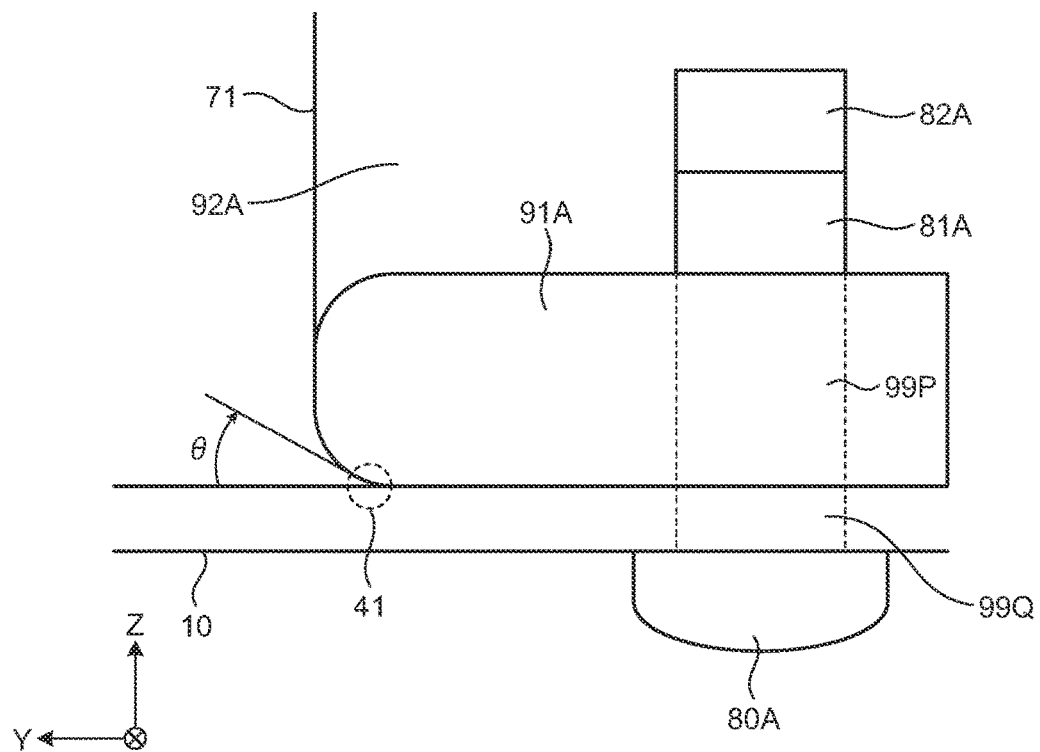
FIG. 25 is a diagram for explaining an electrical triple junction of the L-shaped joint fitting according to the first and second embodiments.

FIG. 25 is a diagram for explaining an electrical triple junction of the L-shaped joint fitting according to the first and second embodiments. FIG. 25 illustrates a structure of the L-shaped joint fitting 71 when the L-shaped joint fitting 71 is viewed from a CX2 direction in FIG. 15. That is, FIG. 25 illustrates a diagram in which the L-shaped joint fitting 71 is viewed from the front. In FIG. 25, the end portion of the bottom surface portion 91A is enlarged.

As illustrated in FIG. 25, the L-shaped joint fitting 71 is disposed on the insulating substrate 10. As a result, the bottom surface portion 91A is fixed to the insulating substrate 10, and the back surface portion 92A extends from the bottom surface portion 91A in a direction perpendicular to the main surface of the insulating substrate 10. In this case, a TJ portion 41 is formed at a boundary point between the insulating substrate 10 and the L-shaped joint fitting 71. Here, as illustrated in FIG. 25, the contact angle of the TJ portion 41 formed by the insulating substrate 10 and the L-shaped joint fitting 71 is defined as a contact angle $\theta$. When the contact angle $\theta$ is 90° or more, lines of electric force do not concentrate on the TJ portion 41, but when chamfering is performed in order to prevent discharge in the air due to the edge of the L-shaped joint fitting 71 itself, the contact angle $\theta$ is less than 90° (acute angle). In this case, the lines of electric force concentrate on the TJ portion 41, that is, the electric field concentrates thereon, whereby creeping discharge occurs.

Therefore, in the third embodiment, in order not to make the contact angle $\theta$ of the TJ portion 41 an acute angle, a gap is provided between the L-shaped joint fitting 71 and the insulating substrate 10, thereby relaxing the electric field concentration in the TJ portion 41 and preventing the creeping discharge.

Figure 26:
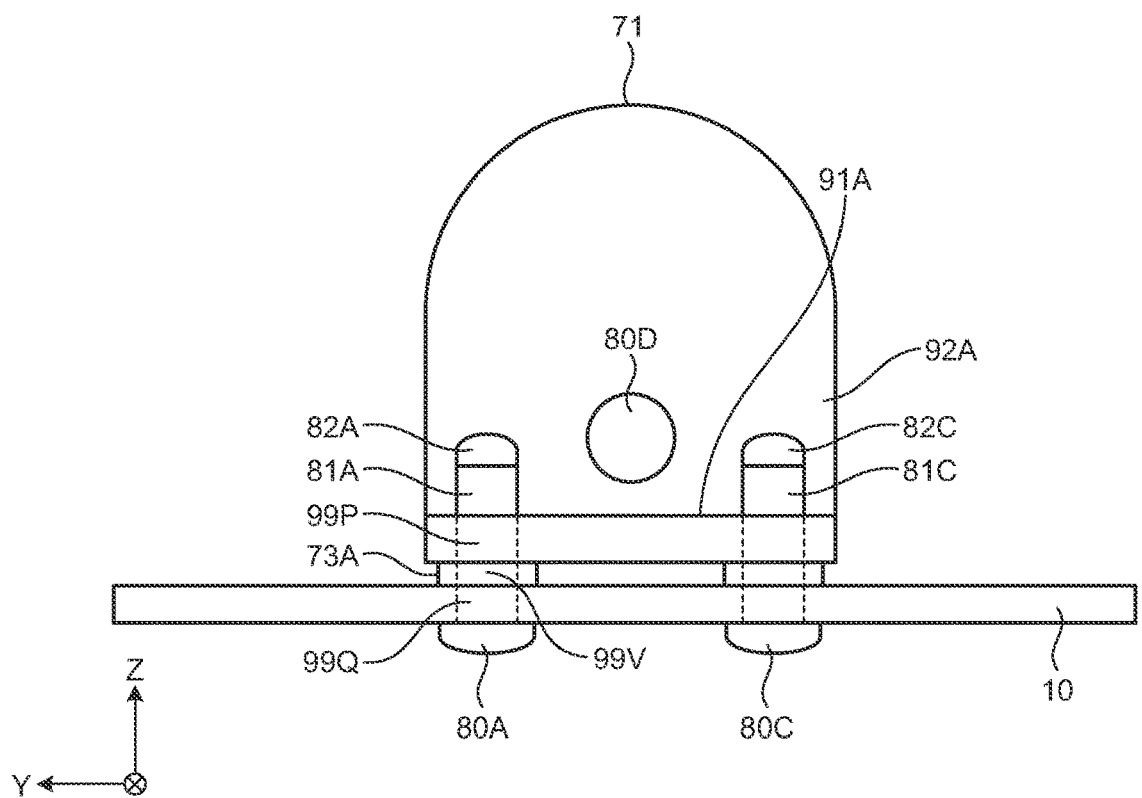
FIG. 26 is a diagram for explaining a configuration of an L-shaped joint fitting on a stage included in a voltage generator according to a third embodiment.
Figure 27:
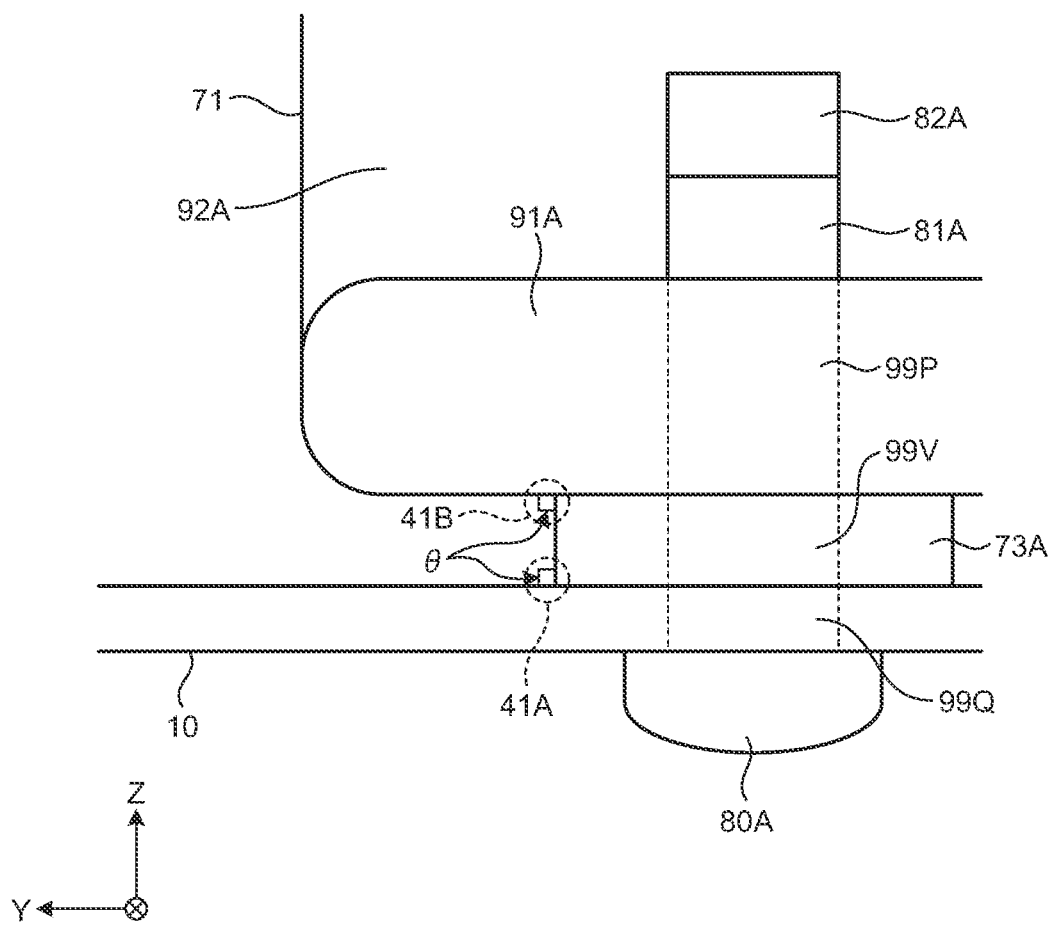
FIG. 27 is a diagram for explaining an electrical triple junction of the L-shaped joint fitting according to the third embodiment.

FIG. 26 is a diagram for explaining a configuration of the L-shaped joint fitting on a stage included in the voltage generator according to the third embodiment. FIG. 27 is a diagram for explaining an electrical triple junction of the L-shaped joint fitting according to the third embodiment. FIGS. 26 and 27 correspond to a structure of the L-shaped joint fitting 71 when the L-shaped joint fitting 71 is viewed from the CX2 direction in FIG. 15. That is, FIGS. 26 and 27 each illustrate a diagram in which the L-shaped joint fitting 71 is viewed from the front. In FIG. 27, the end portion of the bottom surface portion 91A is enlarged.

In the third embodiment, spacers 73A (for example, washers) are provided between the L-shaped joint fitting 71 and the insulating substrate 10. The spacers 73A are disposed at the positions of the bolt through holes 99P formed in the bottom surface portion 91A and the bolt through holes 99Q formed in the insulating substrate 10.

Bolts are passed through the bolt through holes 99P formed in the bottom surface portion 91A, bolt through holes 99V formed in the spacers 73A, and the bolt through holes 99Q formed in the insulating substrate 10, and nuts are screwed onto the bolts, whereby the L-shaped joint fitting 71 is fixed to the insulating substrate 10. In the example of FIG.

26, the bolts 80A and 80C are passed through the bolt through holes 99P, 99V, and 99Q. The bolt 80A is fixed by the fixing nut 81A, and the bolt 80C is fixed by the fixing nut 81C.

In the third embodiment, the spacers 73A are disposed between the L-shaped joint fitting 71 and the insulating substrate 10, so that the gap is formed between the L-shaped joint fitting 71 and the insulating substrate 10. Therefore, the electrical triple junction is not at the boundary point formed by the L-shaped joint fitting 71 and the insulating substrate 10, but a boundary point formed by the L-shaped joint fitting 71 and the spacers 73A and a boundary point formed by the insulating substrate 10 and the spacers 73A.

Note that although the spacer 73A may be either a conductor or a non-conductor, the position of the electrical triple junction changes depending on whether the spacer is a conductor or a non-conductor. In the example of FIG. 27, in a case where the spacer 73A is a non-conductor, the boundary point between the spacer 73A and the bottom surface portion 91A of the L-shaped joint fitting 71 is a TJ portion 41B, and in a case where the spacer 73A is a conductor, the boundary point between the spacer 73A and the insulating substrate 10 is a TJ portion 41A.

Since the L-shaped joint fitting 71 is disposed such that the main surface of the bottom surface portion 91A and the main surface of the insulating substrate 10 are parallel to each other, the contact angle θ of the TJ portion 41B between the spacer 73A and the bottom surface portion 91A or the contact angle θ of the TJ portion 41A between the spacer 73A and the insulating substrate 10 is approximately 90 degrees. That is, the lines of electric force do not concentrate on the TJ portions 41A and 41B, whereby creeping discharge does not occur.

Note that when the spacers 73A are disposed so as to be covered by the bottom surface portion 91A of the L-shaped joint fitting 71, that is, when the spacers 73A are disposed so as not to lie outside the bottom surface portion 91A when the bottom surface portion 91A is viewed from above, discharge in the air from the spacers 73A can be prevented.

The spacers 73A are also disposed between the U-shaped joint fitting 72 and the insulating substrate 10 as between the L-shaped joint fitting 71 and the insulating substrate 10. The spacer 73A disposed between the L-shaped joint fitting 71 and the insulating substrate 10 is a first spacer, and the spacer 73A disposed between the U-shaped joint fitting 72 and the insulating substrate 10 is a second spacer.

As described above, in the third embodiment, the spacers 73A are disposed between the L-shaped joint fitting 71 and the insulating substrate 10, and the spacers 73A are disposed between the U-shaped joint fitting 72 and the insulating substrate 10. As a result, in the TJ portions 41A and 41B formed by the L-shaped joint fitting 71 or the U-shaped joint fitting 72 and the insulating substrate 10, the electric field can be relaxed, and creeping discharge can be prevented.

Fourth Embodiment

Next, a fourth embodiment will be described with reference to FIGS. 32 and 33. In the third embodiment, the spacers 73A are added between the L-shaped joint fitting 71 (U-shaped joint fitting 72) and the insulating substrate 10 to form the gap, whereby creeping discharge triggered by partial discharge in the TJ portion 41 is prevented.

However, in the third embodiment, a creepage distance between electrodes (the leads 9A and 9B of the components, the L-shaped joint fitting 71, the U-shaped joint fitting 72, the bolts, and the like) having different potentials on the insulating substrate 10 cannot be secured, and creeping insulation tolerance may be insufficient. Thus, the fourth embodiment adopts a block construction in which the insulating substrate 10 is separated, thereby improving the creeping insulation tolerance without increasing the size of the voltage generator.

Figure 32:
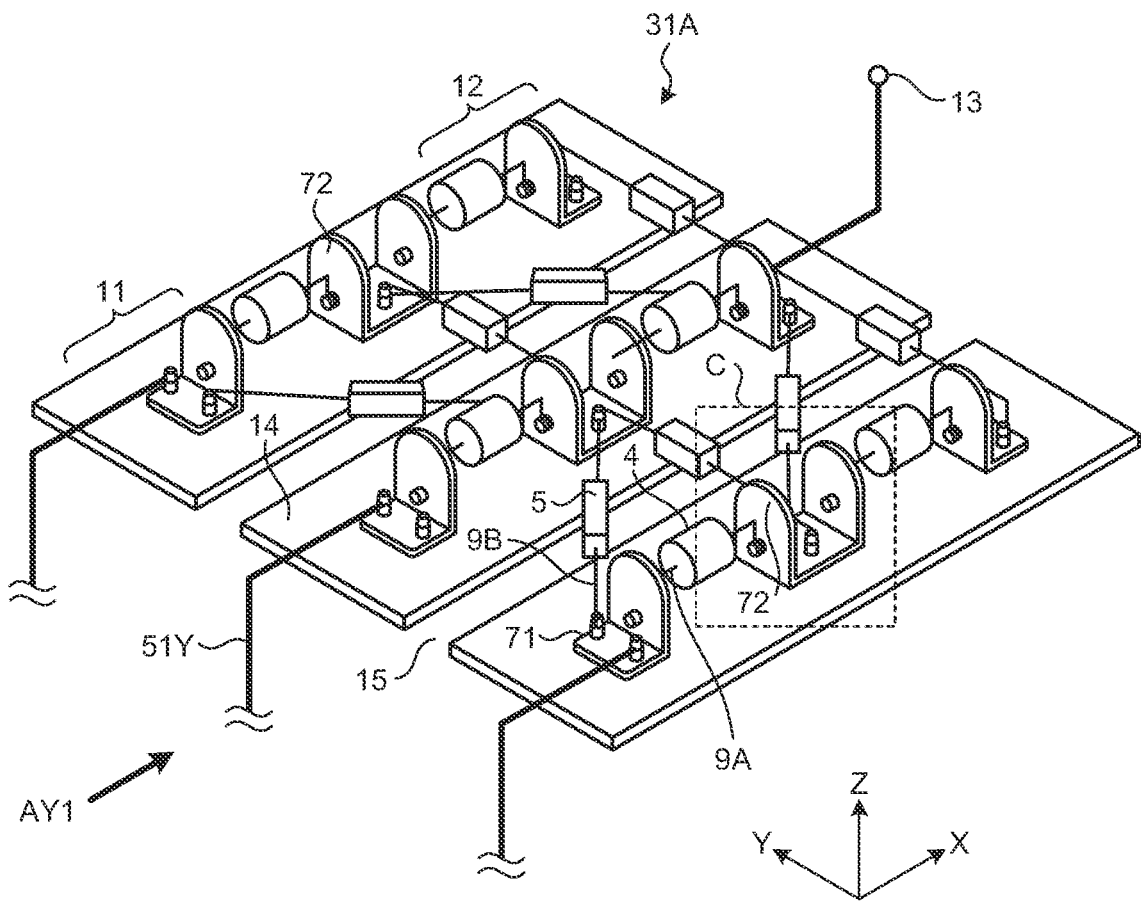
FIG. 32 is a perspective view illustrating a structure of a stage included in a voltage generator according to a fourth embodiment.

FIG. 32 is a perspective view illustrating a structure of the stage included in the voltage generator according to the fourth embodiment. FIG. 33 is a front view illustrating the structure of the stage included in the voltage generator according to the fourth embodiment.

Figure 33:
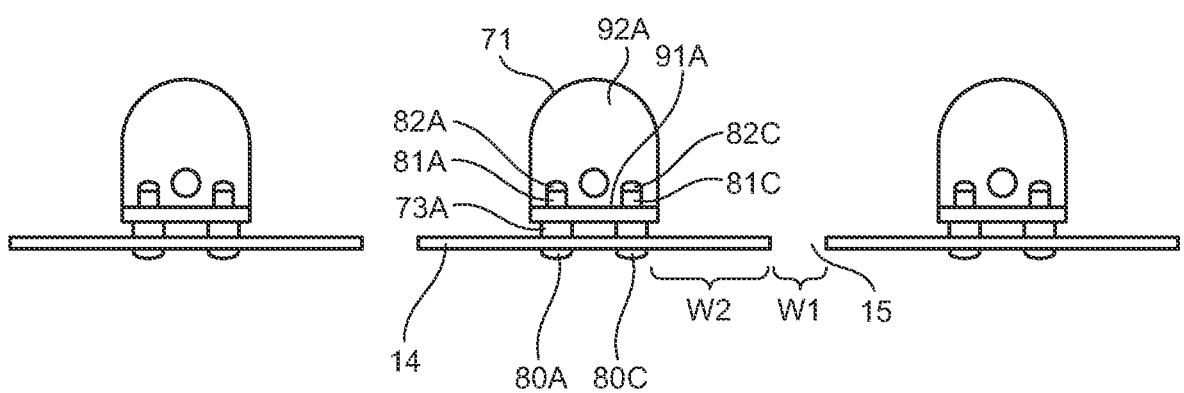
FIG. 33 is a front view illustrating a structure of the stage included in the voltage generator according to the fourth embodiment.

FIG. 33 illustrates the structure of the stage 31A when the stage 31A is viewed from an AY1 direction in FIG. 32. Also, FIG. 33 omits the illustration of the capacitor 4, the diode 5, the U-shaped joint fitting 72, and the connection line 51Y.

FIGS. 32 and 33 illustrate the structure for one stage. Note that since the stages 31A to 31C have similar structures, the structure of the stage 31A will be described here. Components in FIGS. 32 and 33 that achieve the same functions as those of the stage 31A of the first to third embodiments are denoted by the same reference numerals as those assigned to the corresponding components in the first to third embodiments, and thus redundant description will be omitted.

The stage 31A of the fourth embodiment includes split insulating substrates (hereinafter referred to as split substrates 14) obtained when the insulating substrate 10 is divided into three, the capacitors 4, the diodes 5, the L-shaped joint fittings 71, and the U-shaped joint fittings 72. Note that an example of the split substrate 14 is a printed circuit board. The example of FIG. 32 illustrates a case where a plurality of the capacitors 4, a plurality of the diodes 5, a plurality of the L-shaped joint fittings 71, and a plurality of the U-shaped joint fittings 72 are disposed on the split substrates 14.

The split substrates 14 are disposed away from one another by specific distances. That is, the split substrates 14 are disposed with split regions 15 therebetween. The capacitor 4 is disposed between the L-shaped joint fitting 71 and the U-shaped joint fitting 72 on the same split substrate 14, and the diode 5 is disposed across two of the split substrates 14.

Note that although FIG. 32 illustrates the positions where the split substrates 14, the capacitors 4, the diodes 5, the L-shaped joint fittings 71, and the U-shaped joint fittings 72 are disposed, the positions where the split substrates 14, the capacitors 4, the diodes 5, the L-shaped joint fittings 71, and the U-shaped joint fittings 72 are disposed are not limited to those illustrated in FIG. 32. For example, the capacitor 4 may be disposed across the split region 15.

As a result, the split region 15, that is, a gas layer is formed between the electrodes, whereby the creeping insulation tolerance can be improved regardless of the creepage distance between the electrodes. Meanwhile, the split region 15 being the gas layer, the field intensity of the split region 15 between the leads 9B of the diode 5 or between the leads 9A of the capacitor 4 across the split region 15 is determined by a ratio between a gas layer width W1 and a dielectric layer width W2.

Here, the gas layer width W1 is a distance between the split substrates 14 and 14 adjacent to each other, and the dielectric layer width W2 is a distance from the electrode on the split substrate 14 to the split region 15. As the gas layer width W1 is relatively smaller than the dielectric layer width W2, the field intensity of the split region 15 as the gas layer may increase. Therefore, the gas layer width W1 needs to be designed such that the field strength of the split region 15 does not exceed a dielectric breakdown voltage (for example, about 3 kV/mm in the case of air).

As described above, in the fourth embodiment, the diode 5 or the capacitor 4 is disposed across the split region 15 formed by the arrangement of the split substrates 14. As a result, the creeping insulation tolerance can be improved between the electrodes having different potentials on the split substrate 14, and the creeping discharge that occurs along the surface of the split substrate 14 can be prevented. Note that the insulating substrate 10 may be split into two, or may be split into four or more.

Fifth Embodiment

Next, a fifth embodiment will be described with reference to FIGS. 34 and 35. In the fifth embodiment, a method of fixing a plurality of the split substrates 14 will be described.

Figure 34:
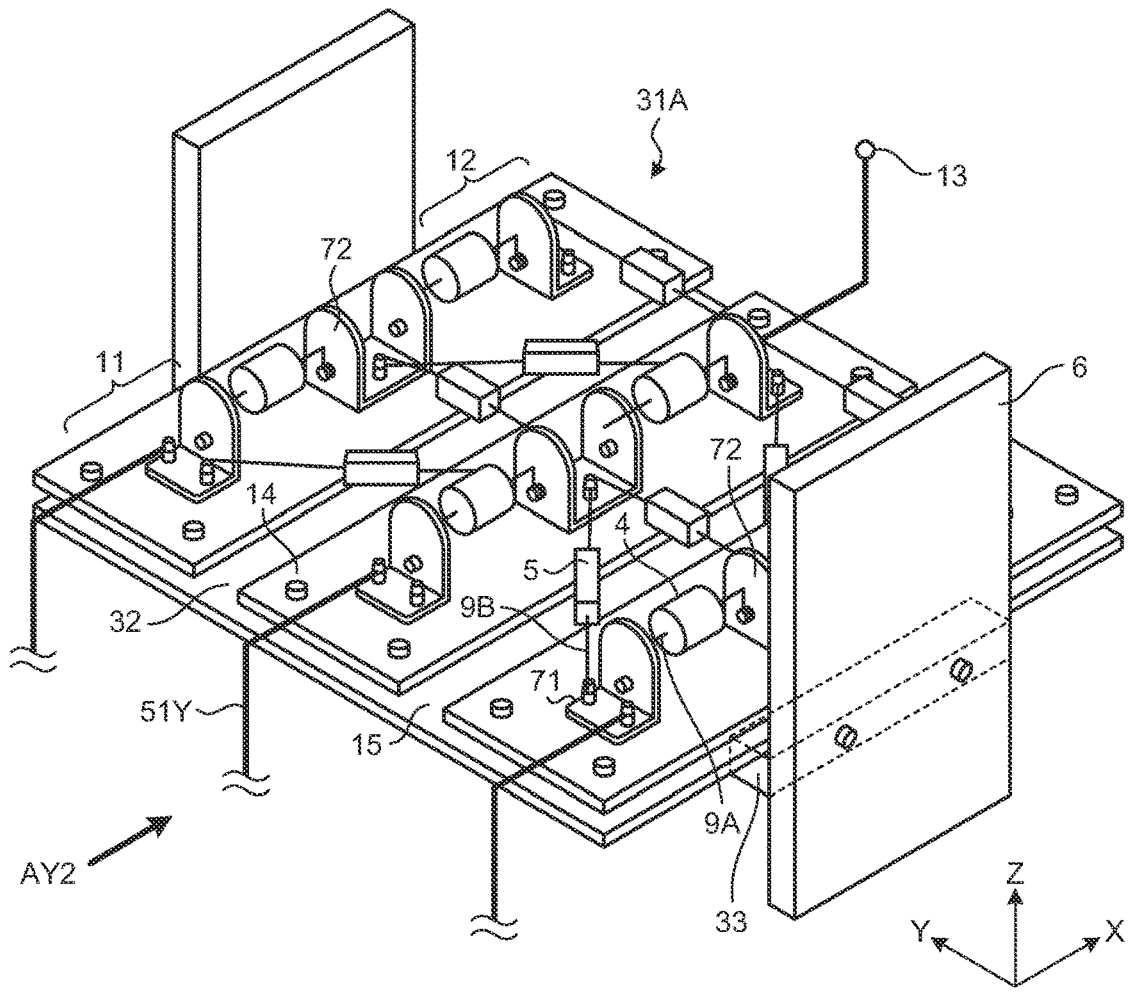
FIG. 34 is a perspective view illustrating a structure of a stage included in a voltage generator according to a fifth embodiment.

FIG. 34 is a perspective view illustrating a structure of the stage included in the voltage generator according to the fifth embodiment. FIG. 35 is a front view illustrating the structure of the stage included in the voltage generator according to the fifth embodiment.

Figure 35:
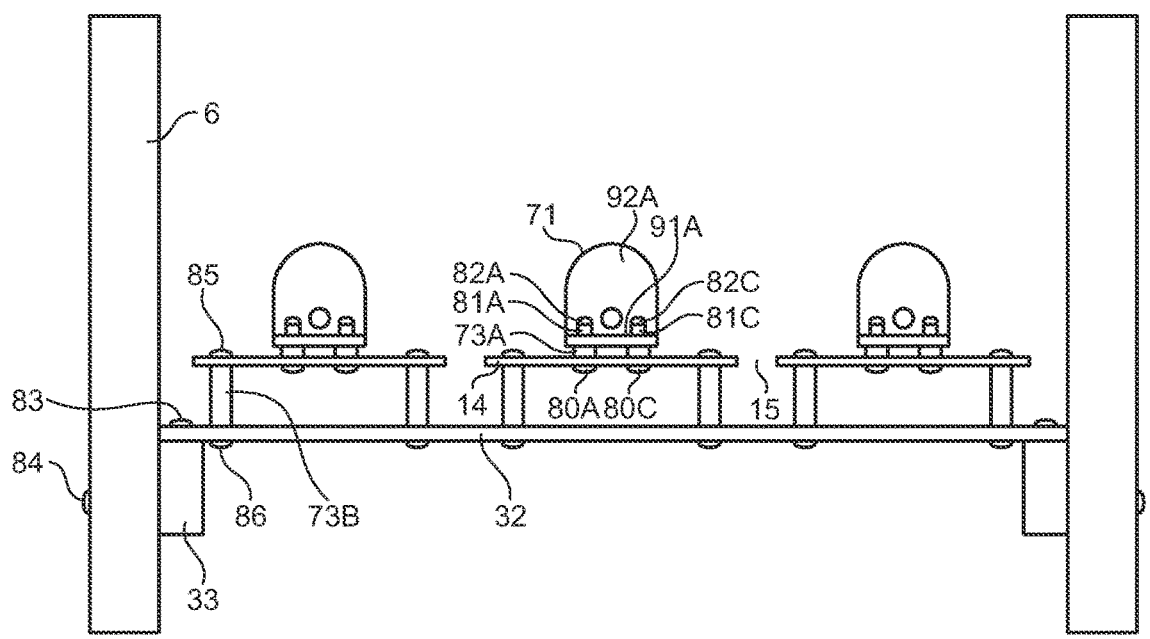
FIG. 35 is a front view illustrating a structure of the stage included in the voltage generator according to the fifth embodiment.

FIG. 35 illustrates the structure of the stage 31A when the stage 31A is viewed from an AY2 direction in FIG. 34. Also, FIG. 35 omits the illustration of the capacitor 4, the diode 5, the U-shaped joint fitting 72, and the connection line 51Y.

FIGS. 34 and 35 illustrate the structure for one stage. Note that since the stages 31A to 31C have similar structures, the structure of the stage 31A will be described here. Components in FIGS. 34 and 35 that achieve the same functions as those of the stage 31A of the first to fourth embodiments are denoted by the same reference numerals as those assigned to the corresponding components in the first to fourth embodiments, and thus redundant description will be omitted.

The voltage generator 100 includes the stage 31A, a base insulating plate 32 as a base, fixing bars 33 for fixing the base insulating plate 32 to the columns 6, bolts 83 to 86, and spacers 73B whose height is adjusted.

The spacers 73B fix the corresponding split substrates 14 away from the base insulating plate 32. That is, the split substrates 14 are each disposed above the base insulating plate 32 via the spacers 73B.

The bolt 83 fixes the fixing bar 33 and the base insulating plate 32. The bolt 84 fixes the column 6 and the fixing bar 33. The bolt 85 fixes the spacer 73B and the corresponding split substrate 14. The bolt 86 fixes the spacer 73B and the base insulating plate 32.

Note that in the example of FIG. 34, bolt insertion holes for passing the bolts are formed in the split substrates 14 and the base insulating plate 32, and screw holes for fixing the bolts are formed in the fixing bars 33, the spacers 73B, and the columns 6. Specifically, bolt insertion holes for passing the bolt 85 are formed in the split substrate 14. Bolt insertion holes for passing the bolts 83 and 86 are formed in the base insulating plate 32. A screw hole for fixing the bolt 83 is formed in the fixing bar 33. A screw hole for fixing the bolt 84 is formed in the column 6. A screw hole for fixing the bolt 85 and a screw hole for fixing the bolt 86 are formed in the spacer 73B.

As described above, in the stage 31A of the fifth embodiment, the split substrates 14 are disposed above the base insulating plate 32 via the spacers 73B whose height is adjusted. As a result, the voltage generator 100 can secure the creepage distance between the column 6 having zero potential and the electrode (the leads 9A and 9B of the components, the L-shaped joint fitting 71, the U-shaped joint fitting 72, the bolts 80A and 80C, and the like) having a potential, and can improve the creeping insulation tolerance.

Moreover, the assembly such as fixing of the split substrates 14 to the base insulating plate 32 and mounting of the components such as the diodes 5 and the capacitors 4 on the split substrates 14 involves only the bolt fastening work, so that the ease of assembly can be improved.

The configurations illustrated in the above embodiments merely illustrate an example so that another known technique can be combined, the embodiments can be combined together, or the configurations can be partially omitted and/or modified without departing from the scope of the present disclosure.

REFERENCE SIGNS LIST

1 CW circuit; 2 inverter circuit; 3A, 3B step-up transformer; 4, 4*a*, 4*b* capacitor; 5, 5*a*, 5*b*, D101 to D113, D201 to D213, Da1, Da2, Db1 to Db4 diode; 6 column; 7 base plate; 9A, 9B lead; 10 insulating substrate; 11 input part; 12 output part; 13 final output part; 14 split substrate; 15 split region; 21, 21A, 21B lead forming portion; 30 outer peripheral container; 31A to 31C stage; 32 base insulating plate; 33 fixing bar; 41, 41A, 41B TJ portion; 50 rectifier circuit unit; 51X, 51Y connection line; 60 voltage doubler booster circuit unit; 61 to 64 connection point; 70 conductive pattern portion; 71 L-shaped joint fitting; 72 U-shaped joint fitting; 73A, 73B spacer; 74 T-shaped joint fitting; 80A to 80I, 83 to 86 bolt; 81A to 81C, 81E, 81F, 81I fixing nut; 82A to 82I covering nut; 91A to 91C bottom surface portion; 92A to 92C back surface portion; 93B front surface portion; 97 edge; 98 lead through hole; 99P to 99W, 99Y bolt through hole; 100 voltage generator; 151A to 151C electric field simulation model; 152 needle; 153 measurement position; 155 left end portion; 161A to 161C field intensity; C01 to C07, Ca, Cb1 direct current capacitor; C11 to C16, C21 to C26, Cb2, Cb3 alternating current capacitor; E1, E2 alternating current power supply; T1 to T3 input terminal.

The invention claimed is:

1. A booster circuit to boost a voltage by a plurality of capacitors and a plurality of diodes disposed on each of a plurality of insulating substrates, the booster circuit comprising:

an input part that is disposed on the insulating substrate to receive a voltage;

an output part that is disposed on the insulating substrate to output a boosted voltage; and an L-shaped joint fitting that is a conductive L-shaped joint fitting disposed on the insulating substrate, wherein the L-shaped joint fitting includes a first bottom surface portion that is plate-shaped and attached to the insulating substrate, and a first back surface portion that is plate-shaped and extends in a specific direction from the first bottom surface portion, and in the input part and the output part, a first capacitor among the plurality of capacitors, a first diode among the plurality of diodes, and a connection line that connects the plurality of insulating substrates are electrically connected to the L-shaped joint fitting at a first component connecting portion, and the L-shaped joint fitting is disposed such that a first lead forming portion that is a bent portion of a first lead connected to the first capacitor, a second lead forming portion that is a bent portion of a second lead connected to the first diode, and the first component connecting portion fit within an area of a main surface of the first back surface portion when the main surface of the first back surface portion is viewed from a direction perpendicular to the main surface of the first back surface portion, and fit within an area of a main surface of the first bottom surface portion when the main surface of the first bottom surface portion is viewed from a direction perpendicular to the main surface of the first bottom surface portion.

2. The booster circuit according to claim 1, further comprising
a U-shaped joint fitting that is a conductive U-shaped joint fitting disposed on the insulating substrate, wherein
the U-shaped joint fitting includes a second bottom surface portion that is plate-shaped and attached to the insulating substrate, a second back surface portion that is plate-shaped and extends in a specific direction from the second bottom surface portion, and a front surface portion that is plate-shaped, is bent from the second bottom surface portion and extends in a specific direction, and faces the second back surface portion, and
a second capacitor among the capacitors, a second diode among the diodes, and the insulating substrate are electrically connected to the U-shaped joint fitting at a second component connecting portion, and the U-shaped joint fitting is disposed such that a third lead forming portion that is a bent portion of a third lead connected to the second capacitor, a fourth lead forming portion that is a bent portion of a fourth lead connected to the second diode, and the second component connecting portion fit within an area of a main surface of the second back surface portion when the main surface of the second back surface portion is viewed from a direction perpendicular to the main surface of the second back surface portion.

3. The booster circuit according to claim 2, wherein
the U-shaped joint fitting is disposed such that the third lead forming portion, the fourth lead forming portion, and the second component connecting portion fit within an area of a main surface of the front surface portion when the main surface of the front surface portion is viewed from a direction perpendicular to the main surface of the front surface portion.

4. The booster circuit according to claim 2, or wherein
between an upper surface of the insulating substrate and the second bottom surface portion of the U-shaped joint fitting, a gap is formed by a second spacer disposed so as not to lie outside the second bottom surface portion when viewed from an upper surface side of the second bottom surface portion.

5. The booster circuit according to claim 2, wherein
an outer periphery of the U-shaped joint fitting is subjected to edge processing so as to be rounded, and a rim of the outer periphery of the U-shaped joint fitting is subjected to chamfering processing.

6. The booster circuit according to claim 2, wherein
a portion from the third lead forming portion disposed on a side of the front surface portion among the third lead forming portions to the second component connecting portion disposed on the side of the front surface portion among the second component connecting portions is in contact with the main surface of the front surface portion, and
a portion from the third lead forming portion disposed on a side of the second back surface portion among the third lead forming portions to the second component connecting portion disposed on the side of the second back surface portion among the second component connecting portions is in contact with the main surface of the second back surface portion.

7. The booster circuit according to claim 1, wherein
between an upper surface of the insulating substrate and the first bottom surface portion of the L-shaped joint fitting, a gap is formed by a first spacer disposed so as not to lie outside the first bottom surface portion when viewed from an upper surface side of the first bottom surface portion.

8. The booster circuit according to claim 1, wherein
an atmosphere environment in which the insulating substrate is disposed is filled with air, dry air, nitrogen, hydrogen, or sulfur hexafluoride.

9. A voltage generator comprising:
an inverter circuit to generate an alternating current voltage;
a step-up transformer to step up an output voltage from the inverter circuit; and
the booster circuit according to claim 1 to boost an output voltage from the step-up transformer.

10. A booster circuit to boost a voltage by a plurality of capacitors and a plurality of diodes disposed on each of a plurality of insulating substrates, the booster circuit comprising:
an input part that is disposed on the insulating substrate to receive a voltage;
an output part that is disposed on the insulating substrate to output a boosted voltage; and
an L-shaped joint fitting that is a conductive L-shaped joint fitting disposed on the insulating substrate, wherein
the L-shaped joint fitting includes a first bottom surface portion that is plate-shaped and attached to the insulating substrate, and a first back surface portion that is plate-shaped and extends in a specific direction from the first bottom surface portion,
in the input part and the output part, a first capacitor among the plurality of capacitors, a first diode among the plurality of diodes, and a connection line that connects the plurality of insulating substrates are electrically connected to the L-shaped joint fitting at a first component connecting portion, and the L-shaped joint fitting is disposed such that a first lead forming portion that is a bent portion of a first lead connected to the first capacitor, a second lead forming portion that is a bent portion of a second lead connected to the first diode, and the first component connecting portion fit within an area of a main surface of the first back surface portion when the main surface of the first back surface portion is viewed from a direction perpendicular to the main surface of the first back surface portion, and
a portion of the first lead from the first lead forming portion to the first component connecting portion is in contact with the main surface of the first back surface portion.

11. The booster circuit according to claim 10, further comprising
a U-shaped joint fitting that is a conductive U-shaped joint fitting disposed on the insulating substrate, wherein
the U-shaped joint fitting includes a second bottom surface portion that is plate-shaped and attached to the insulating substrate, a second back surface portion that is plate-shaped and extends in a specific direction from the second bottom surface portion, and a front surface portion that is plate-shaped, is bent from the second bottom surface portion and extends in a specific direction, and faces the second back surface portion, and a second capacitor among the capacitors, a second diode among the diodes, and the insulating substrate are electrically connected to the U-shaped joint fitting at a second component connecting portion, and the U-shaped joint fitting is disposed such that a third lead forming portion that is a bent portion of a third lead connected to the second capacitor, a fourth lead forming portion that is a bent portion of a fourth lead connected to the second diode, and the second component connecting portion fit within an area of a main surface of the second back surface portion when the main surface of the second back surface portion is viewed from a direction perpendicular to the main surface of the second back surface portion.

12. The booster circuit according to claim 11, wherein the U-shaped joint fitting is disposed such that the third lead forming portion, the fourth lead forming portion, and the second component connecting portion fit within an area of a main surface of the front surface portion when the main surface of the front surface portion is viewed from a direction perpendicular to the main surface of the front surface portion.

13. The booster circuit according to claim 11, wherein a portion from the third lead forming portion disposed on a side of the front surface portion among the third lead forming portions to the second component connecting portion disposed on the side of the front surface portion among the second component connecting portions is in contact with the main surface of the front surface portion, and a portion from the third lead forming portion disposed on a side of the second back surface portion among the third lead forming portions to the second component connecting portion disposed on the side of the second back surface portion among the second component connecting portions is in contact with the main surface of the second back surface portion.

14. The booster circuit according to claim 11, wherein between an upper surface of the insulating substrate and the second bottom surface portion of the U-shaped joint fitting, a gap is formed by a second spacer disposed so as not to lie outside the second bottom surface portion when viewed from an upper surface side of the second bottom surface portion.

15. The booster circuit according to claim 11, wherein an outer periphery of the U-shaped joint fitting is subjected to edge processing so as to be rounded, and a rim of the outer periphery of the U-shaped joint fitting is subjected to chamfering processing.

16. The booster circuit according to claim 10, wherein between an upper surface of the insulating substrate and the first bottom surface portion of the L-shaped joint fitting, a gap is formed by a first spacer disposed so as not to lie outside the first bottom surface portion when viewed from an upper surface side of the first bottom surface portion.

17. The booster circuit according to claim 10, wherein an atmosphere environment in which the insulating substrate is disposed is filled with air, dry air, nitrogen, hydrogen, or sulfur hexafluoride.

18. A voltage generator comprising:
an inverter circuit to generate an alternating current voltage;
a step-up transformer to step up an output voltage from the inverter circuit; and
the booster circuit according to claim 10 to boost an output voltage from the step-up transformer.

19. A booster circuit to boost a voltage by a plurality of capacitors and a plurality of diodes disposed on each of a plurality of insulating substrates, the booster circuit comprising:
an input part that is disposed at a substrate end of the insulating substrate to receive a voltage;
an output part that is disposed at the substrate end of the insulating substrate to output a boosted voltage; and
an L-shaped joint fitting that is a conductive L-shaped joint fitting disposed at the substrate end of the insulating substrate, wherein
the L-shaped joint fitting includes a first bottom surface portion that is plate-shaped and attached to the insulating substrate, and a first back surface portion that is plate-shaped and extends in a specific direction from the first bottom surface portion, and
in the input part and the output part, a first diode among the plurality of diodes and a connection line that connects the plurality of insulating substrates are electrically connected to the L-shaped joint fitting at a first component connecting portion, and the L-shaped joint fitting is disposed such that a first lead forming portion that is a bent portion of a first lead connected to the first diode and the first component connecting portion fit within an area of a main surface of the first back surface portion when the main surface of the first back surface portion is viewed from a direction perpendicular to the main surface of the first back surface portion, and fit within an area of a main surface of the first bottom surface portion when the main surface of the first bottom surface portion is viewed from a direction perpendicular to the main surface of the first bottom surface portion.

20. A voltage generator comprising:
an inverter circuit to generate an alternating current voltage;
a step-up transformer to step up an output voltage from the inverter circuit; and
the booster circuit according to claim 19 to boost an output voltage from the step-up transformer.

* * * * *